United States Patent
Hatwar et al.

(10) Patent No.: US 9,263,701 B2
(45) Date of Patent: Feb. 16, 2016

(54) COATED ARTICLE AND/OR DEVICE WITH OPTICAL OUT-COUPLING LAYER STACK (OCLS) INCLUDING VACUUM DEPOSITED INDEX MATCH LAYER OVER SCATTERING MATRIX, AND/OR ASSOCIATED METHODS

(71) Applicant: Guardian Industries Corp., Auburn Hills, MI (US)

(72) Inventors: Tukaram K. Hatwar, Penfield, NY (US); Willem Den Boer, Brighton, MI (US); Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 13/826,495

(22) Filed: Mar. 14, 2013

(65) Prior Publication Data

US 2014/0264293 A1    Sep. 18, 2014

(51) Int. Cl.
| | |
|---|---|
| *H01L 51/56* | (2006.01) |
| *H01L 51/52* | (2006.01) |
| *C08G 83/00* | (2006.01) |
| *C09D 7/00* | (2006.01) |

(52) U.S. Cl.
CPC .......... *H01L 51/5268* (2013.01); *C08G 83/001* (2013.01); *C09D 7/00* (2013.01); *H01L 51/5275* (2013.01); *Y10T 428/24893* (2015.01)

(58) Field of Classification Search
CPC .. H01L 51/5268; H01L 51/56; C08G 83/001; C09D 7/00; B05D 5/061; Y10T 428/24893
USPC ....... 257/40; 427/126.2, 58; 428/206; 438/29

IPC ...... H01L 51/5268,51/56; C08G 83/001; C09D 7/00; B05D 5/061; Y10T 428/24893
See application file for complete search history.

(56) References Cited

U.S. PATENT DOCUMENTS

| | | | |
|---|---|---|---|
| 6,383,571 | B1 | 5/2002 | Muhlfriedel |
| 7,601,436 | B2 | 10/2009 | Djurovich et al. |

(Continued)

FOREIGN PATENT DOCUMENTS

| | | |
|---|---|---|
| KR | 10-2012-0125824 | 11/2012 |
| WO | WO 2006/013373 | 2/2006 |

OTHER PUBLICATIONS

U.S. Appl. No. 13/488,779, filed Jun. 5, 2012; Veerasamy.

(Continued)

*Primary Examiner* — Hrayr A Sayadian
(74) *Attorney, Agent, or Firm* — Nixon & Vanderhye P.C.

(57) ABSTRACT

Certain example embodiments relate to light emitting diode (e.g., OLED and/or PLED) inclusive devices, and/or methods of making the same. Certain example embodiments incorporate an optical out-coupling layer stack (OCLS) structure that includes a vacuum deposited index matching layer (iML) provided over an organo-metallic scattering matrix layer. The iML may be a silicon-inclusive layer and may include, for example, vacuum deposited SiOxNy. The OCLS including scattering micro-particles, the iML, and the anode may be designed such that the device extraction efficiency is significantly improved, e.g., by efficiently coupling the light generated in the organic layers of the devices and extracted through the glass substrate. In certain example embodiments, the refractive index of the ITO, SiOxNy index matching layer, OCLS scattering layer and the glass substrate may be provided in decreasing order.

15 Claims, 13 Drawing Sheets

(56) References Cited

U.S. PATENT DOCUMENTS

| | | |
|---|---|---|
| 7,629,741 B2 | 12/2009 | Liao et al. |
| 7,659,661 B2 | 2/2010 | Park |
| 7,662,663 B2 | 2/2010 | Cok et al. |
| 7,663,311 B2 | 2/2010 | Im et al. |
| 7,663,312 B2 | 2/2010 | Anandan |
| 8,357,553 B2 | 1/2013 | Veerasamy et al. |
| 2011/0042696 A1* | 2/2011 | Smith et al. ............ 257/89 |
| 2012/0086022 A1 | 4/2012 | Veerasamy et al. |
| 2012/0086023 A1* | 4/2012 | Veerasamy et al. ............ 257/88 |
| 2012/0087127 A1 | 4/2012 | Veerasamy et al. |
| 2012/0088319 A1* | 4/2012 | Veerasamy et al. ............ 438/27 |
| 2012/0112225 A1* | 5/2012 | Le Bellac et al. ............ 257/98 |
| 2013/0005139 A1* | 1/2013 | Krasnov et al. ............ 438/652 |
| 2013/0129919 A1 | 5/2013 | Veerasamy et al. |
| 2013/0320838 A1 | 12/2013 | Veerasamy |

OTHER PUBLICATIONS

International Search Report mailed Jul. 4, 2014.

\* cited by examiner

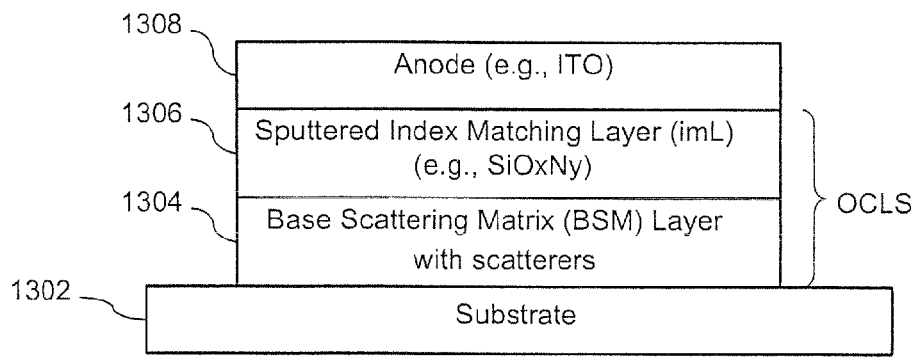
FIG. 13a
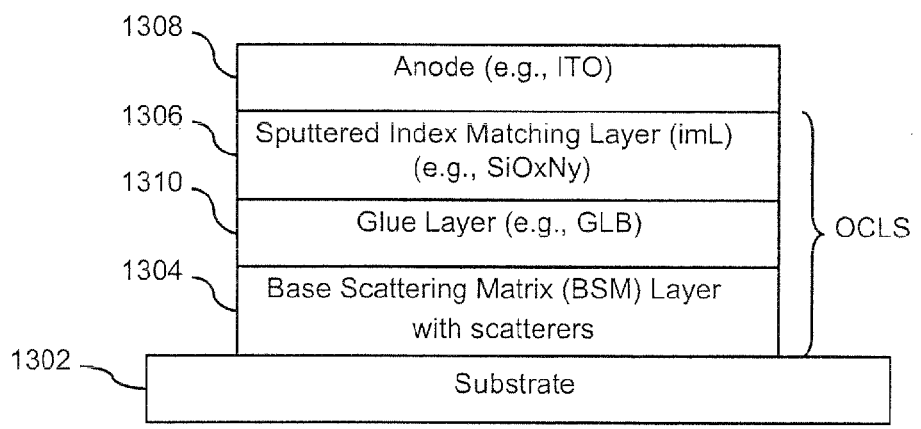
FIG. 13b
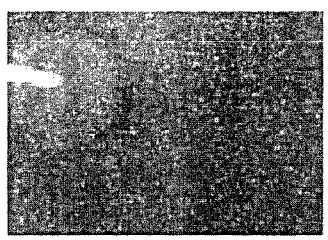 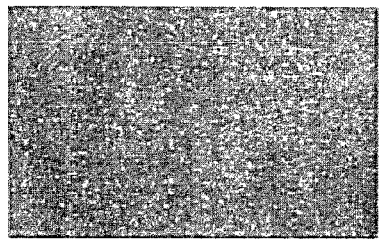 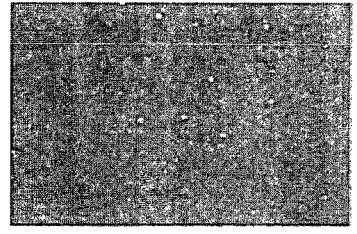
FIG. 14a         FIG. 14b         FIG. 14c

| | Measurement ID | Y C/2 | x C/2 | y C/2 | L* C/2 | a* C/2 | b* C/2 |
|---|---|---|---|---|---|---|---|
| QUV | 20111108-1 QUV 25 d Exposed | 89.79 | 0.3113 | 0.3174 | 95.91 | 0.01 | 0.66 |
| QUV | 20111108-1 No QUV 25/ Shielded | 90.47 | 0.3108 | 0.3169 | 90.19 | -0.01 | 0.43 |
| | 20111108-1 Virgin | 90.03 | 0.3108 | 0.317 | 96.01 | -0.01 | 0.44 |

COATED ARTICLE AND/OR DEVICE WITH OPTICAL OUT-COUPLING LAYER STACK (OCLS) INCLUDING VACUUM DEPOSITED INDEX MATCH LAYER OVER SCATTERING MATRIX, AND/OR ASSOCIATED METHODS

This application incorporates by reference the entire contents of U.S. application Ser. No. 13/488,779, filed Jun. 5, 2012.

Certain example embodiments relate to coated articles and/or devices with optical out-coupling layer stacks, and/or methods of making the same. More particularly, certain example embodiments relate to out-coupling layer stacks that include a vacuum deposited silicon-inclusive index matching layer provided over an organo-metallic scattering matrix layer for use in an OLED and/or other device, and/or associated methods.

BACKGROUND AND SUMMARY OF CERTAIN EXAMPLE EMBODIMENTS

An organic light emitting diode (OLED) is a light-emitting diode (LED) in which the emissive electroluminescent layer is a film of organic compounds that emit light in response to an electric current. This layer of organic semiconductor material is situated between two electrodes in some cases. Generally, for example, at least one of these electrodes is transparent. OLEDs (based on polymers and/or evaporable small molecules) sometimes are used in television screens; computer monitors; small or portable system screens such as those found on mobile phones and PDAs; and/or the like. OLEDs may also sometimes be used in light sources for space illumination and in large-area light-emitting elements. OLED devices are described in, for example, U.S. Pat. Nos. 7,663,311; 7,663,312; 7,662,663; 7,659,661; 7,629,741; and 7,601,436, the entire contents of each of which are hereby incorporated herein by reference.

A typical OLED comprises two organic layers—namely, electron and hole transport layers—that are embedded between two electrodes. The top electrode typically is a metallic mirror with high reflectivity. The anode is typically a transparent conductive layer supported by a glass substrate. The top electrode generally is the cathode, and the bottom electrode generally is the anode. Indium tin oxide (ITO) often is used for the anode.

FIG. 1 is an example cross-sectional view of an OLED. The glass substrate 102 supports a transparent anode layer 104. The hole transmitting layer 106 may be a carbon nanotube (CNT) based layer in some cases, provided that it is doped with the proper dopants. Conventional electron transporting and emitting and cathode layers 108 and 110 also may be provided.

When a voltage is applied to the electrodes, the charges start moving in the device under the influence of the electric field. Electrons leave the cathode, and holes move from the anode in opposite direction. The recombination of these charges leads to the creation of photons with frequencies given by the energy gap (E=hv) between the LUMO and HOMO levels of the emitting molecules, meaning that the electrical power applied to the electrodes is transformed into light. Different materials and/or dopants may be used to generate different colors, with the colors being combinable to achieve yet additional colors.

The technology has desirable attributes such as large viewing angle, fast response time, high contrast, and a Lambertian profile.

Although significant progress has been made on the electronic quality of the emissive and charge carrier layers, a significant portion of the light emitted is trapped by both the ITO coating on the glass and the underlying glass substrate, e.g., as wave-guiding modes promoted by interference effects. Because of this inefficiency, some of these devices are driven at higher current densities than what normally would be required. This unfortunately has a negative influence on their lifetimes. Even under these non-nominal driving conditions, the luminous efficiency of OLEDs can be significantly below that of fluorescent lamps.

Indeed, it unfortunately is typical for only 20-30% of the photons generated in an OLED on a planar substrate to be extracted into the air. Because of the refractive mismatch between the active OLED layer (where the refractive index is about 1.75 @ 550 nm) and the ITO anode (where the refractive index is about 2.0 @ 550 nm), most of the light is trapped in the device because of total internal reflection, and only a small fraction enters the glass substrate and is actually emitted into the air to serve useful functions.

It would be desirable to improve the light output of an OLED device, e.g., through a light out-coupling strategy. Doing so could improve the lifetime and/or overall luminous efficiency of the device. Several techniques have been proposed to improve the light efficiency, but these methods unfortunately do not meet the practical requirements of manufacturability.

As alluded to above, there have been several attempts to improve techniques for light extraction efficiency. For example, an attempt has been made to increase the extraction from the substrate into the air by way of adding micro-refractive or diffractive structures (e.g., arrays of micro-lenses or pyramids, scattering layers, etc.) to the substrate surface. Depending on the reflectance of the OLED stack, the extraction from the substrate into the air can be increased considerably, typically up to 30%. Unfortunately, however, these structures tend to be quite fragile.

Another attempt relates to monochromatic light emitting devices. In such devices, the angular distribution of the light emitted into the substrate depends on the layer thicknesses of the OLED stack (e.g., by virtue of the micro-cavity effect). By proper design, the amount of light in the escape cone of the substrate can be increased and external efficiencies of up to 40% can be reached at the design wavelength.

Still another approach involves harnessing the "organic modes" that represent about 50% of the generated photons by the introduction of ordered or random scattering structures into the OLED stack. There is a drawback, however, in terms of a possible negative influence on the electrical performance, inasmuch as the anode would be rough, and localized current hot spots that are detrimental to device performance can develop.

A persistent challenge involves attempts at matching the refractive index of the glass substrate and the organic layers so that the organic modes are turned into substrate modes. The amount of light extracted into the substrate can indeed be increased by a factor of 2-3, at least theoretically.

Provided that the OLED has a highly reflective cathode and is thick enough, 80% of the photons generated inside the OLED can be extracted into a high index substrate. However, the remaining issue is still then to out-couple this light into air without reverting back to one of the above-described strategies.

FIG. 2 shows different major light modes in connection with a schematic view of an OLED device. The dashed line in FIG. 2 shows an escape cone. As can be seen, the major modes include a light in air mode (A), which is the fraction of the light that actually emits in the air; a light in substrate mode (B), which is the fraction of the light that is travelling and trapped in the transparent glass substrate; and a light trapped in the organic layers and/or the ITO mode (C), which is the fraction of the light travelling inside and trapped in the organic layers and the high index ITO anode. It will be appreciated that there may be more "B-modes" where the glass is thicker and/or more absorptive. It also is noted that there is another component related to Plasmon losses in the cathode, although this is not depicted in the FIG. 2 schematic view. That is, in a surface Plasmon mode, light is trapped at the organic cathode reflector interface (which oftentimes is an organic to aluminum interface). The failure modes are typical for a bottom emitting OLED device, where light is emitted through the glass substrate.

In view of the foregoing, it will be appreciated that there is a need in the art for techniques for improving the light emitting efficiencies of OLED devices.

One aspect of certain example embodiments relates to a light out-coupling layer stack (OCLS) on a substrate (e.g., on a glass substrate), with a view towards reducing wave-guiding modes.

Another aspect of certain example embodiments relates to scalable techniques for achieving higher luminous efficiency in OLEDs.

Another aspect of certain example embodiments relates to an OCLS structure that includes a vacuum deposited index matching layer (imL) provided over an organo-metallic scattering matrix layer. In certain example embodiments, the imL may be a silicon-inclusive layer and may comprise, for example, silicon oxide, silicon nitride, and/or silicon oxynitride. The imL may be oxygen graded, and thus index graded, in certain example embodiments.

Still another example embodiment relates to an integrated anode glass plate for an OLED or other device. The integrated anode glass plate may include, for example, a soda lime based glass substrate, an OCLS, and an anode comprising ITO or the like. The OCLS may be structured as set forth as noted in the previous paragraph, in certain example instances.

In certain example embodiments, a method of making a coated article is provided. A base scattering matrix layer is wet applied, directly or indirectly, on a glass substrate, e.g., with a precursor for the base scattering matrix layer including an organo-metallic chelate of a high index material and siloxane solvent. The wet applied base scattering matrix layer is cured. A silicon-inclusive index matching layer (e.g., of or including SiOxNy) is vacuum coated, directly or indirectly, on the cured base scattering matrix layer. An anodic layer (e.g., of or including ITO) is vacuum coated, directly or indirectly, on the index matching layer. The cured base scattering matrix layer has a refractive index of 1.55-1.75 (e.g., 1.6-1.7), the index matching layer has a refractive index of 1.7-1.9, and the anodic layer has a refractive index of 1.9-2.1. According to certain example embodiments, the glass substrate may have a refractive index of less than 1.6.

According to certain example embodiments, an additional planarizing layer, a layer comprising GLB may be disposed on the base scattering matrix layer, with the index matching layer being disposed directly over and contacting the layer comprising GLB.

In certain example embodiments, a method of making an electronic device is provided. A coated article (e.g., an integrated anode plate) made according to the example methods herein is provided. The anodic layer is patterned. A hole transport layer, an emitting layer, and a reflective cathodic layer, in that order, are disposed on the patterned anodic layer, in making the electronic device.

The emitting layer may be an electronic transport and emitting layer, and the electronic device may be an OLED-based device, in certain example embodiments. In other example embodiments, the electronic device may be a PLED-based device.

In certain example embodiments, a coated article is provided. The coated article may comprise: a glass substrate; a base scattering matrix layer that is wet applied, directly or indirectly, on the glass substrate, with the base scattering matrix layer including an isotropic layer matrix including an organo-metallic chelate hybrid matrix with scatterers dispersed therein; a silicon-inclusive index matching layer that is sputter-deposited, directly or indirectly, on the base scattering matrix layer; and a transparent conductive coating (TCC) that is sputter-deposited, directly or indirectly, on the index matching layer. The base scattering matrix layer has a refractive index of 1.6-1.7, the index matching layer has a refractive index of 1.7-1.9, and the TCC has a refractive index of 1.9-2.1.

According to certain example embodiments, the cured base scattering matrix layer may be about 3-20 (e.g., more preferably 3-10, and sometimes 5) microns thick and/or may have an average surface roughness (Ra) less than 4 nm. It is noted that the thickness may be increased to a point up until a point where it cracks.

In certain example embodiments, an electronic device is provided. The electronic device may comprise a glass substrate; a base scattering matrix layer that is wet applied, directly or indirectly, on the glass substrate, with the base scattering matrix layer having a thickness of about 3-20 (e.g., 5) microns when cured and including an isotropic layer matrix including an organo-metallic chelate hybrid matrix with high refractive index light scatterers dispersed therein; a silicon-inclusive index matching layer that is sputter-deposited, directly or indirectly, on the base scattering matrix layer; and a first transparent conductive coating (TCC) that is sputter-deposited on the index matching layer. Refractive indices of the glass substrate, the base scattering matrix layer, the index matching layer, and the first TCC may increase with each layer, moving away from the glass substrate. A hole transport layer, an emitting layer, and a reflective second TCC (e.g., a cathode) may be disposed, in that order, over the first TCC.

According to certain example embodiments, the index matching layer may comprise silicon oxynitride and optionally may be at least 200 nm thick, the first TCC may be anodic and optionally may comprise ITC), and the second TCC may be cathodic and may comprise Al, Ag, Pd, Cu, and/or the like, or a combination thereof.

These and other embodiments, features, aspect, and advantages may be combined in any suitable combination or sub-combination to produce yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIGS. 13a and 13b are cross-sectional views of integrated anode plates in accordance with certain example embodiments;

FIGS. 14a-14c are optical microscope images of a sample produced in accordance with certain example embodiments;

DETAILED DESCRIPTION OF CERTAIN EXAMPLE EMBODIMENTS

Figure 1:
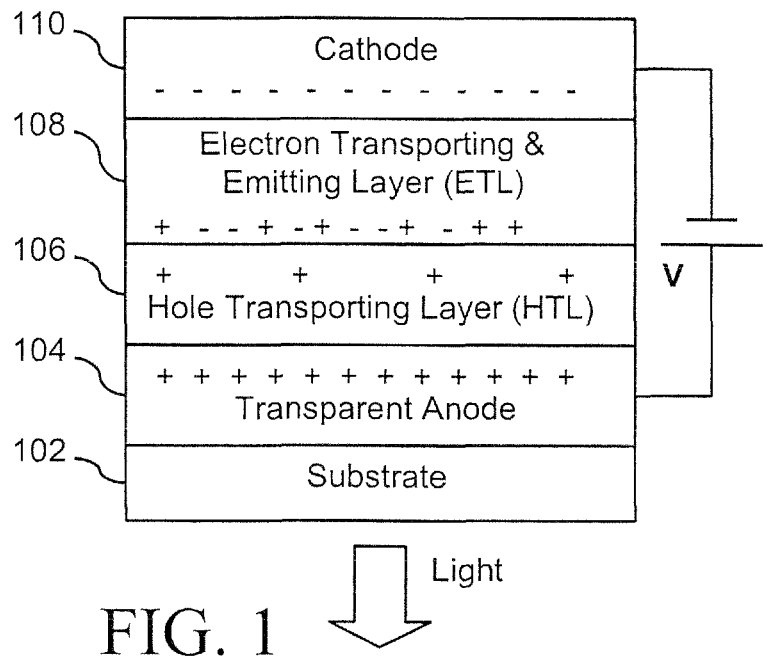
FIG. 1 is an example cross-sectional view of an OLED.
Figure 2:
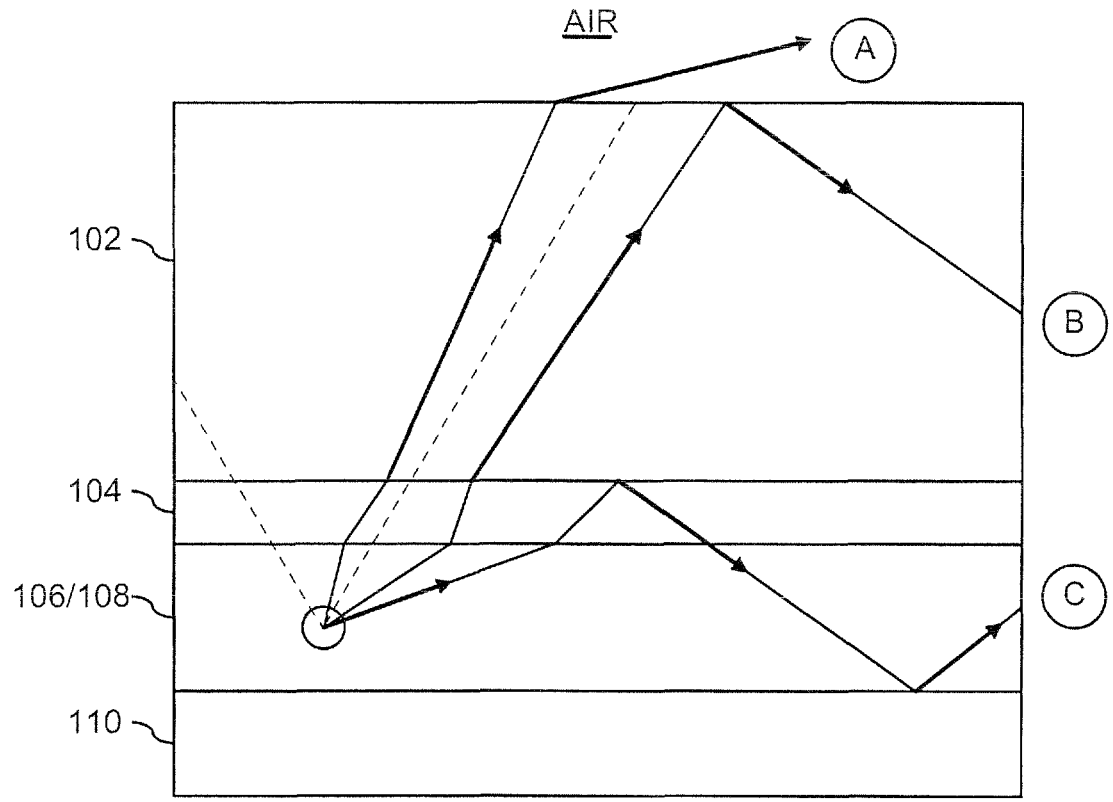
FIG. 2 shows different major light modes in connection with a schematic view of an OLED device.

A significant amount of emitted light from an organic light emitting diode (OLED) may be trapped as a result of total internal reflection (TIR) within several layers and interfaces (e.g., the light emitting-anode, anode-glass, and glass-air interfaces). It has been observed that only about 50% of the light emitted makes it into the glass substrate, with the trapped light being absorbed within the anode/organic layers/cathode layer stack. Certain example embodiments increase the light extraction efficiency by combining both an index matching layer, as well as a total internal reflection (TIR) frustrating medium on one or both sides of the glass in a manner that helps improve forward scattering of light. For example, a model of the current OLED structure is developed based on the Mie-Lorenz theory and, based on this mode, it is possible to simulate and optimize forward Mie scattering by solving for the S matrix. Provided the cathode is a perfect reflector, almost 100% of light trapped by the TIR can be extracted if the radius of the scatters, scatterer index profile, refractive index ratio between the matrix and the scatterer, and concentration of the scatterers are carefully selected. The light extraction is defined by the equation, $\Gamma o/\Gamma_i = \eta_{imL} \times \eta_s$. Certain example embodiments make use of this approach and involve an OCLS layer stack system. Data is provided to support the beneficial effect in the case of spherical scatterers in a high index matrix. While certain example embodiments may be used in connection with solid state light sources, the example approaches described herein may additionally or alternatively be used in other applications where light extraction for a distributed light source over a certain solid angle is necessary or desirable.

As indicated above, certain example embodiments help improve the light emitting efficiencies of OLED devices, e.g., through an optical out-coupling layer stack (OCLS) system. An OCLS may help to provide an index matching layer between the glass and ITO/organic stack (and/or polymer LED stack), e.g., to help increase the light otherwise coupled into the glass. Mie-like scattering caused by the OCLS may help to frustrate the wave-guiding modes in the glass, e.g., by breaking down the in-phase coherence. In a related manner, Mie-like forward scattering may be increased, even with reduced spectral dispersion.

For example, $\Gamma_i(\Omega, k)$ can be defined as the photon flux incident to the glass surface, and $\Gamma_o(\Omega, k)$ can be defined as the output flux in air, where the symbols $\Omega$ and k are solid angle and wave vector, respectively. The ratio is now boosted by a factor $\eta_{imL} \times \eta_s(\Omega, k)$, where $\eta$ is the index matching efficiency of the OCLS matrix/adjacent planarizer and where $\eta_s$ is the scattering efficiency. The total flux output can the be calculated by computing the double integral $\iint \Gamma_i(\Omega, k)\eta_{imL} \times \eta_s(\Omega, k) d\Omega dk$ over the entire phase space. However, based on this model, one can see that the necessary condition is that the product $\eta_{imL} \times \eta_s > 1$. Certain example embodiments described below demonstrate how this regime can be implemented.

The OCLS may be a multilayer system in certain example embodiments, with its functionality being based at least in part on how its various components are optimized so as to achieve the desired performance. In certain example embodiments, the OCLS may include a thick isotropic layer matrix, with a matrix layer core that includes dispersed spherical scatterers, and an optional planarization layer. Each of these components is discussed in greater detail, below.

As indicated above, the OCLS may include a thick isotropic layer matrix, e.g., located between the glass and anode. This layer may include an organo-metallic chelate hybrid with a high refractive index, preferably greater than 1.7, more preferably of 1.8-1.9, and potentially even higher in some cases. The absorption coefficient may be near zero in some cases. The chemistry of the matrix layer is described in, for example, U.S. Pat. No. 8,357,553, the entire contents of which are hereby incorporated herein by reference.

As the '553 patent describes, certain example embodiments may involve hybrid coating systems based on polymeric titanium dioxide and/or polymeric zirconia based systems. The organic-inorganic hybrid polymer solution is prepared by first reacting the titanium alkoxide with a chelating agent to convert the highly reactive tetra-coordinate titanium species to a less reactive hexa-coordinate species. Other desired polymer components may then be added to the stabilized titanium containing solution and thoroughly mixed. As a result of the stabilization, the hybrid polymer solution may be stable at room temperature up to 6 months with negligible change in color and viscosity. The hybrid polymer solution may be spin-coated or vertical slot coated onto substrates to a desired thickness.

A titanium dioxide rich film was generated by thermally decomposing the hybrid coatings at an elevated temperature of less than about 250 degrees C. The resulting dried films may be made as thin as 0.2 um and up to about 4 um or more. Such films may have good transparency and have refractive indices as high or higher than about 1.90 in the entire visible region when the cure temperature was 300 degrees C. or higher. A crack-free film over 300 nm in thickness was obtained with a single coating application. Multiple-coating is applicable to obtain a thicker film, and no apparent interface was seen from SEM cross-section images between two consecutive coatings. The hybrid high refractive index films are mechanically robust, stable upon exposure to both heat and UV radiation, and may be applicable for a wide variety of optical applications. The material is compatible with semiconducting material.

In certain example embodiments, the organic-inorganic hybrid polymer may be introduced into a laminable medium such as ethylene-vinyl acetate (EVA), silicones, aramids, etc. This would then allow the use of vacuum bonding or de-airing, sometimes without the use of autoclave.

The organic polymers chosen contained multiple hydroxy functionalities. They were so chosen to allow primary or secondary chemical bonding between the polymer and the titanium dioxide phase to promote phase compatibility and a high degree of dispersion. The chelated poly(dibutyl titanate) polymer and the organic polymer are compatible in all or substantially all proportions, both in solution and in the cured film, as evidenced by their high transparency and the refractive index dispersion curves. Typically, an index as high as or higher than 1.9 is obtained at 550 nm for a thickness of 0.4 um. When deposited on any inorganic light emitting diode, even a film as thin as 0.4 microns dramatically improves the light out-coupling from the high refractive index material significantly typically in the incremental range of 70%.

An inorganic-based precursor is provided. In certain example embodiments, the inorganic-based precursor may be a titanium-based precursor such as, for example, titanium alkoxide, a titanium-based phosphate complex, etc. The inorganic-based precursor may be deposited directly or indirectly on the device and/or substrate to be coated. For instance, in certain example embodiments, a titanium alkoxide based precursor may be deposited via atomic layer deposition (ALD), a titanium-based phosphate layer may be printed, etc. Of course, it will be appreciated that other high-index inorganic materials may be used in place of or in addition to the titanium in certain example embodiments.

A chelate may be formed, and an organic component may be added, together with optional additives. The chelate in certain example instances may be salicylic acid. The organic component in certain example embodiments may be a resin, silicone, polyimide, polyamide, and/or the like. Optional additives also may be introduced. For instance, other inorganic materials (e.g., in place of or in addition to the titanium-based precursor) may be introduced to tune the index of refraction. Indeed, the index of refraction may be adjusted upwardly or downwardly by selective inclusion of zirconia, silica and/or silicates, etc. Light scattering elements and/or heat dissipating elements also may be introduced. One example material that functions both as a lighter scattering agent and a heat dissipater is boron nitride. Plasticizers also may be included in certain example embodiments.

The chelated titanium-based precursor and the organic component(s) may be cross-linked to create an organic-inorganic hybrid solution. In one example, titanium alkoxide may be reacted with a chelating agent to convert the tetra-coordinate Ti species into a less reactive hexa-coordinate species, e.g., to create chelated poly(dibutyl titanate). Of course, other titanates may be created and/or used in different embodiments of this invention. The hybrid polymer may result in certain example instances by mixing together the chelated poly(dibutyl titanate) with a hydroxy inclusive organic resin. In certain example embodiments, the organic and inorganic components may be provided in equal percentages by weight. In certain example embodiments, the organic and inorganic components may be provided in a ratio of 60/40 by weight. Of course, other ratios and/or percentages are possible in different embodiments of this invention.

The hybrid solution may be quite liquidous in certain example embodiments. In such a case, the hybrid solution may be wet applied, vertical slot meniscus coated, or otherwise provided to a desired thickness. Example coating techniques are described in, for example, U.S. Pat. No. 6,383,571, the entire contents of which are hereby incorporated herein by reference. In certain example embodiments, however, it may be desirable to provide a more viscous hybrid laminate (e.g., inorganic and/or other materials included in an organic binder such as EVA, silicones, aramids, etc.) that can be extruded, for example. A more viscous hybrid laminate may be advantageous in terms of a "cleaner" or "less messy" application.

The coated hybrid polymer or laminate is dried and/or cured. The drying and/or curing may help to remove solvents and water, leaving more inorganic material than organic material in certain example embodiments. The drying may take place at a first elevated temperature of less than about 250 degrees C., whereas the curing may take place at a second elevated temperature of greater than or equal to about 300 degrees C. Certain example embodiments may include one or both of drying and curing at these and/or any other suitable temperature.

Thus, in summarizing these example basic formulation, cross-linking, and curing steps, it will be appreciated that a chelated Ti-based precursor is brought into contact with a resin binder; the resin binder and the chelated Ti-based precursor are cross-linked; the solvent is evaporated through a heating process, and the cured film is adhered to a substrate (e.g., a film, hard surface, glass, etc.). In so doing, either (a) the organic-inorganic hybrid solution is wet applied on the substrate over the at least one LED, or (b) the organic-inorganic hybrid solution is introduced into a carrier medium and then the carrier medium is extruded onto the substrate over the at least one LED. The organic-inorganic hybrid solution is cured once disposed on the substrate, e.g., in forming the coating.

The rheological property of the matrix preferably is such that it can be dispensed either by zone casting or a slot meniscus coating over large areas of glass, and rapidly cured, e.g., by heat and/or UV exposure. When cured, it may help to effectively index match to the anode (e.g., no inclusive) and light emitting (e.g., organic) layers. In some cases, this portion of the OCLS may be 10-100 um in thickness. The smoothness of this layer preferably is on the order of the smoothness of glass and has an RMS roughness of less than or equal to 1.0 nm and more preferably of less than or equal to about 0.5 nm.

One of the routes for the matrix implementation is the use of glassy polymeric monomer to which titanium, hafnium, and/or zirconium oxo-clusters are added. When polymerization of the monomer is done in the presence of 10-30% by weight of $ZE_4O_2(OMc)_{12}$, for example, a clear and high index film is produced with high flexural strength and extremely good adhesion to the glass substrate. The use of an appropriate surfactant and coupling agent may assist in slot dispensing uniformity. The organic surface of $Ti_{16}O_{16}(OEt)_{32}$ cluster can be selectively modified by alcoholysis. This gives rise to new functional clusters, $Ti_{16}O_{16}(OEt)_{32}$-x(OR)x, where R can be a methacrylate or styrene and x is the number of modified alkoxy ranging anywhere from 4 to 16 depending, for example, on the pH.

The resulting matrix thus combines advantages of polymers (e.g., processability, flexural strength, etc.) and those of inorganic building blocks (such as, for example, high refractive index in the case of the transition alkaloids and chemical inertness, thermal and environmental stability, etc.). The index matching layer (imL) alone has good out-coupling efficiencies for incidence angles near zero and is also angle dependent.

Figure 3:
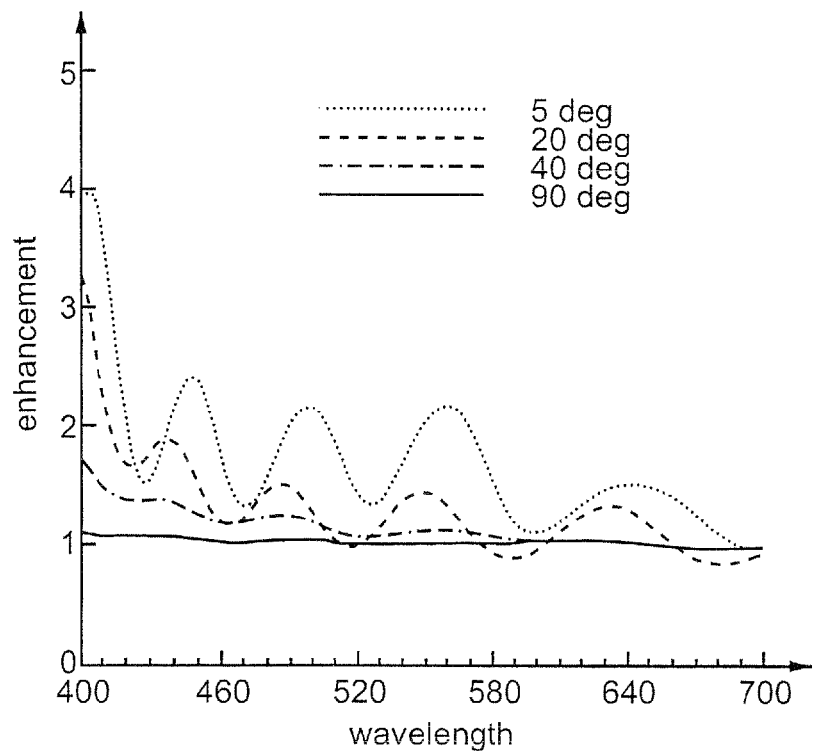
FIG. 3 shows the efficiency of the index matching layer matrix of certain example embodiments as a function of wavelength and angle of incidence.

FIG. 3 shows the efficiency of the imL matrix of certain example embodiments as a function of wavelength and angle of incidence. A refractive index of 1.9 at 500 nm and a dispersion typical of the metallo-organic polymer was used in generating the FIG. 3 data, e.g., in accordance with the '553 patent.

The matrix layer core includes generally spherical scatterers that preferably are dispensed in such a manner that they are not clumped together. The Zeta potential of the scatterer colloid used preferably is high for good stability of the system, and sometimes is even greater than 70 mV. As is known, the Zeta potential refers to electro-kinetic potential in colloidal systems. Zeta potential is the potential difference between the dispersion medium and the stationary layer of fluid attached to the dispersed particle. Those skilled in the art generally consider a value of 25 mV as the value that separates low-charged surfaces from highly-charged surfaces. It is noted that the Zeta potential value sometimes is related to the stability of the colloidal dispersion, e.g., such that high values indicate greater stability, etc. These values also help ensure that the scatterer filling density is in a range of values such that the spheres are mono-dispersed with an inter-particle distance d of about 3 sphere-diameters (or 6r). If this condition is met, then their separation is sufficiently large so that contribution of secondary waves to the field exciting each particle is much smaller than the external field.

The total scattered field therefore can be approximated by the sum of scattered fields generated by an individual independent scatterer. This regime is called a single scattering event. In this regime, each scatterer preferably is located in the far field of its nearest neighbor, and preferably there is no systematic phase relationship. One exception is the case of exact forward scattering, which is generally always coherent. In the other extreme, when the density of particles is large, then each particle scatters light that has already been scattered by other particles. This condition gives rise to diffuse scattering, which can have a large backscatter response. The condition of diffuse scattering can be promoted by setting a threshold limit to scatterer density. The scatterers thus may be produced in a manner so that they have a surface static charge and, when placed in the pre-cured matrix layer, helps keep the particles apart. The scatterers can be made of an optically soft but low k material (e.g., refractive index less than medium and thus, for example, somewhere between 1.3-1.7, for instance), such that the ratio of ns/nl=m<1. However one can use values such that m≥1 in other example embodiments.

Figure 4A:
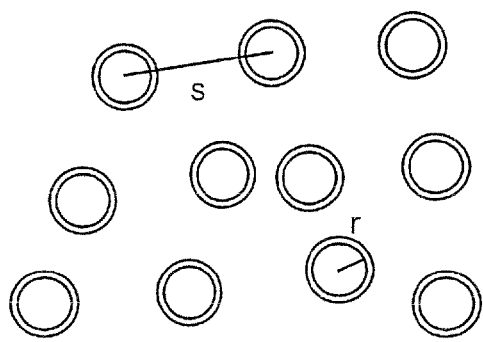
FIGS. 4a and 4b schematically show mono-dispersed scatterers with different inter-distance spacings, and with different Zeta potentials.
Figure 4B:
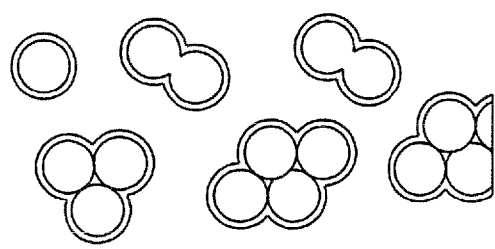

FIGS. 4a and 4b schematically show mono-dispersed scatterers with different inter-distance spacing s, and with different Zeta potentials. In FIG. 4a, the inter-distance spacing s is greater than 3d, which helps to ensure a single scatter. The Zeta potential in FIG. 4a is high, e.g., at a value greater than 75 mV. By contrast, FIG. 4b shows agglomerated or clustered scatters in a high-index isotropic matrix. The Zeta potential in FIG. 4b is low, e.g., at about of about 10 mV.

Figure 5A:
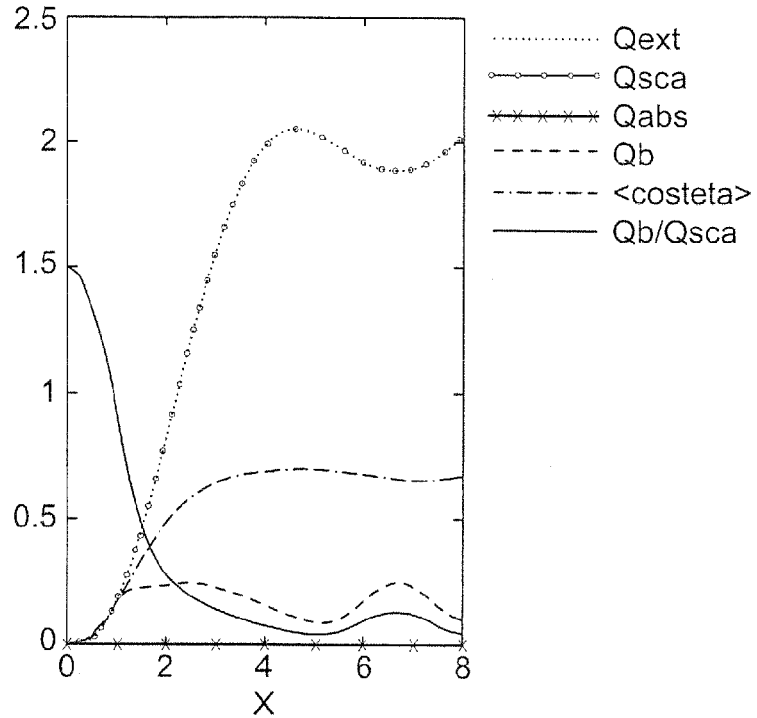
FIG. 5a is a graph plotting the scattering efficiency of one scatterer in connection with certain example embodiments.
Figure 5B:
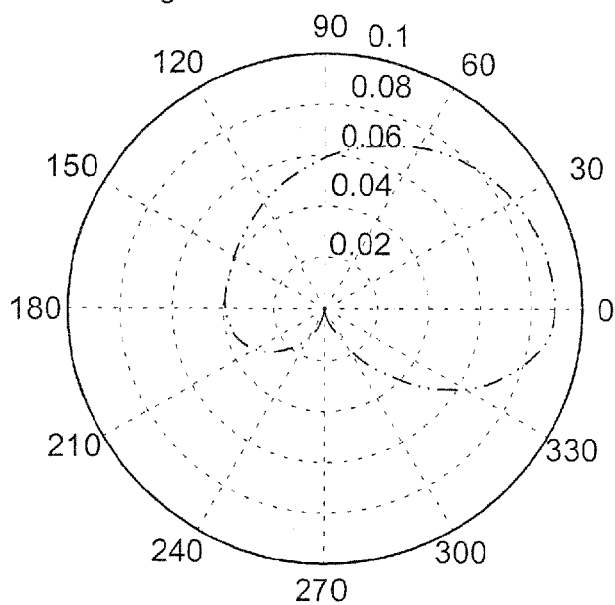
FIG. 5b shows half angular distributions for Γ(θ) at the top half of the graph, and Γ(φ) at the bottom half of the graph, at different scattering angles, in accordance with certain example embodiments.

FIG. 5a is a graph plotting the scattering efficiency of one scatterer in connection with certain example embodiments. The graph is a function of x=2πrm/λ, where the symbols π, r, and λ keep their usual meanings, and where m is the relative refractive index ratio (ns/nm). In the regime of single scatter event, the total scatter function is a summation of all scatters in a given volume. FIG. 5b shows half angular distributions for Γ(θ) at the top half of the graph, and Γ(φ) at the bottom half of the graph, at different scattering angles, in accordance with certain example embodiments. Both functions are substantially symmetrical about the horizontal axis. Thus, it can be seen from FIG. 5b that there are two half curves that are (i) the polar (top half) and (ii) Azimuthal (bottom half) of the scattering distribution function. It will be appreciated that plot (i) could be drawn in its entirety by basically reflecting about the x axis of the curve, and that the same applies to plot (ii). Because each half plot is substantially symmetric about the x axis, a measure of how the whole scattering function works is conveyed.

Figure 6:
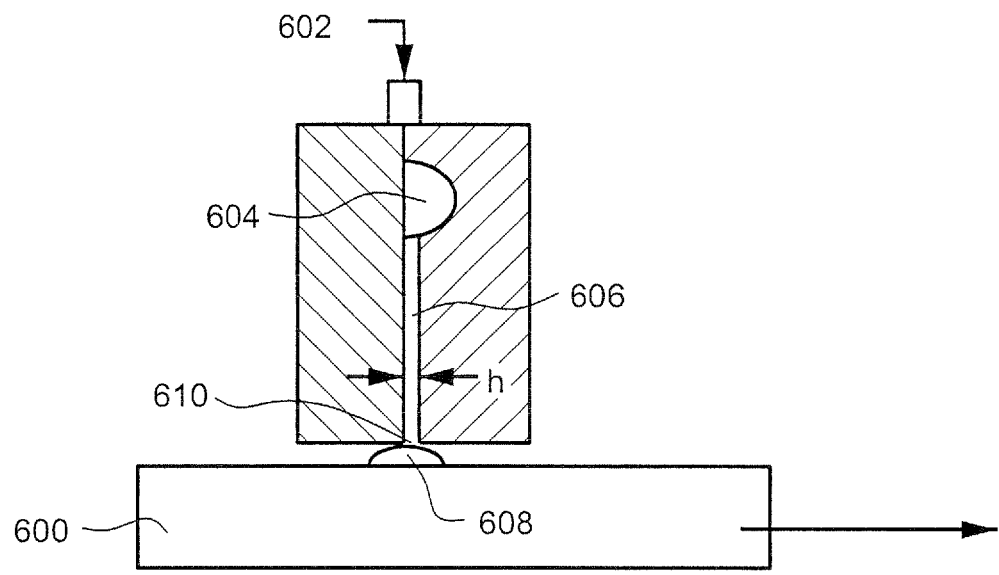
FIG. 6 is a schematic view of a slot meniscus coater, dispensing a matrix with scatterers, in accordance with certain example embodiments.

FIG. 6 is a schematic view of a slot meniscus coater, dispensing a matrix with scatterers, in accordance with certain example embodiments. In the FIG. 6 embodiment, the coater is stationary as the substrate 600 moves relative to it, although this need not always be the case in different example embodiments (e.g., the coater may move while the substrate 600 is stationary). The material to be coated is inserted into the coater at an inlet 602. Excess material is at least temporarily held in a cavity 604, as the remainder proceeds down the slot 606. The width h of the slot 606 helps in the formation of the meniscus 608 proximate to the slot exit 610.

Of course, it will be appreciated that higher or lower separations may be provided in certain example embodiments. It also will be appreciated that the scatterers need not necessarily be perfectly spherical and other shapes (e.g., eye-shaped spheres, oblong spheres, etc.) may be used (and potentially "mixed and matched") in different example embodiments. Cylinders also may be used and may prove beneficial in some cases, e.g., as a result of their anisotropy.

An optional planarization layer may be over-coated onto the cured matrix and scattering layers. The planarization layer may comprise a zinc-based chelate (e.g., a ZnO-inclusive polymer layer), and may help to anneal out roughness remaining from the scattering layer. This layer can be dispensed by a slot meniscus coater and cured, by heat and/or UV. After curing, the ZnO-inclusive polymer layer also may help act as a seed for the anode disposed thereon. For instance, this planarization layer may serve as a seed for an ITO inclusive film that is deposited by, for example, MSVD or other suitable process. The planarization layer therefore may be compatible with the ITO deposition and processing techniques.

It therefore will be appreciated that a transparent conductive oxide (TCO), such as ITO or the like, may be disposed directly or indirectly on the planarization layer. This TCO may help to ensure that the final OLED stack functions in an electro-optically desirable manner. However, the TCO layer need not necessarily be considered a part of the OCLS in all example embodiments.

One natural modeling approach to aid in understanding light trapping in OLED devices is based on ray tracing techniques. Such techniques also may be used to model many properties of the scattering matrix. Unfortunately, however, ray tracing is somewhat disadvantageous in that it tends to underestimate backscattering. Thus, certain example embodiments advantageously make use of the Mie Scattering Model. The scattering coefficients an, bn, en and dn, are calculated, and the scattering matrix is computed. The amplitude of the scattered field can then be computed as a function of the incident field:

$$\begin{pmatrix} E_{\|s} \\ E_{\perp s} \end{pmatrix} = \frac{e^{ik(r-z)}}{-ikr} \begin{pmatrix} S_2 & S_3 \\ S_4 & S_1 \end{pmatrix} \begin{pmatrix} E_{\|i} \\ E_{\perp i} \end{pmatrix}$$

The elements of the amplitude scattering matrix in general depend on the scattering angle and the azimuthal angle. Stokes parameters (which generally refer to the set of values that describe the polarization state of electromagnetic radiation) are incorporated into the amplitude scattering matrix, and the procedure as per van de Hulst (e.g., in "Light Scattering by Small Particles," Dover Books on Physics, 1981) may be followed. In order to test the validity of the assumption, the onset of multiple scattering may be computed for simple spherical scatterers, the radiative transfer method described per Chandrasekhar (e.g., in "Radiative Transfer," Dover Books on Physics, 2011) may be followed.

Figure 7:
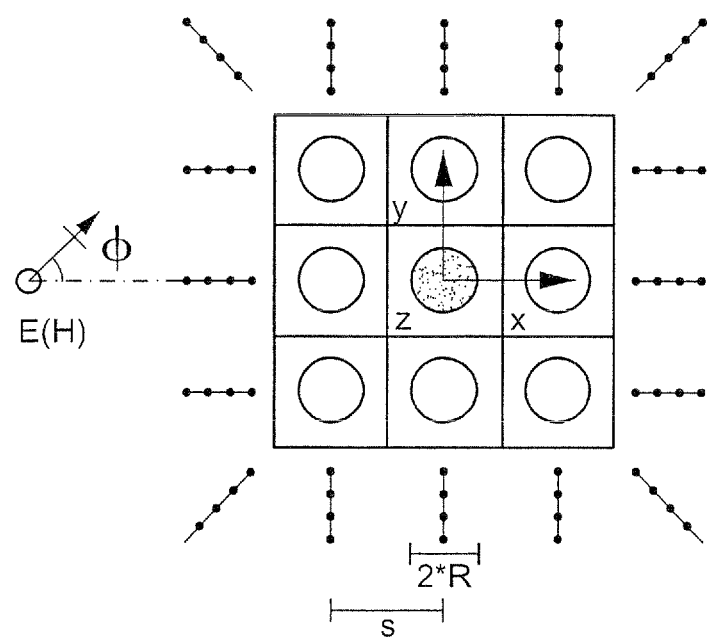
FIG. 7 is a graphical formulation of the light trapping problem to be solved.

FIG. 7 is a graphical formulation of the light trapping problem to be solved. A two-dimensional cross-sectional array of dielectric rods of diameter b=2R in a periodic square lattice, with a period a=S, is shown in the in the FIG. 7 formulation.

Referring once again to FIG. 5a, it can be seen that the first maximum in the scattering efficiency where x is equal to about 4. With an x-value of 4 and for a value of m equal to about 0.45, this corresponds to a value of d of from about 0.8-1.6 microns. Now, using the condition that s is about 3*d, one achieves a number density ranging from 0.5 to 1 particle per cubic micron, depending on the packing density. These parameters also explain why the thickness of the scattering layer to be in the order of at least 10 microns.

Effective medium approximation (EMA) refers to physical models that describe the macroscopic properties of a medium based on the properties and relative fractions of its components. The following equations may help determine the effective medium approximation (EMA) for the matrix in the different modes:

For the transverse magnetic mode where there is no magnetic field in the z direction (TMz mode), with p polarization:

$$\varepsilon_{\mathit{eff}} = \varepsilon_0 + \frac{\pi^2}{3}[f(1-f)(\varepsilon_2 - \varepsilon_1)]^2 \alpha^2 + O(\alpha^4)$$

For the transverse electric mode where there is no magnetic field in the z direction (TEz mode), with s polarization:

$$\varepsilon_{\mathit{eff}} = \frac{1}{a_0} + \frac{\pi^2}{3}\left[f(1-f)\frac{(\varepsilon_2 - \varepsilon_1)}{\varepsilon_2 \varepsilon_1}\right]^2 \frac{\varepsilon_0}{a_0^3}\alpha^2 + O(\alpha^4)$$

The symbols (e.g., $\pi$ and $\in_{\mathit{eff}}$) take their usual meanings. In addition, in the above equations:

$a_0 = f/\in_2 - (1-f)/\in_1$, $\in_0 = \in_2 f - \in_1(1-f)$, and $\alpha = 2R/\lambda_0$.

It is noted that the refractive index n of the OCLS may be equal to about the square root of epsilon. The index may be graded in certain example embodiments, e.g., as a function of the thickness (or z-axis) of the OCLS. The grading may be from nearly n=2 (e.g., if the anode is of or includes ITO) down to about 1.5 towards the glass. It also is noted that it is possible in certain example embodiments to use a metal grid instead of ITO for the anode. For instance, the grid may be coated with a field matrix hole injection layer followed by the EL layer and, in this particular case, the index of the OCLS may be graded from about 1.88 to the value of glass, e.g., as a function of z.

In certain example embodiments, the scatterers may get smaller near the surface, e.g., in terms of the diameters or major distances of the various distributions. For instance, the size may be graded from a 2 micron average diameter or major distance to 0.5 microns and even to a nanometric level at the surface.

Figure 8:
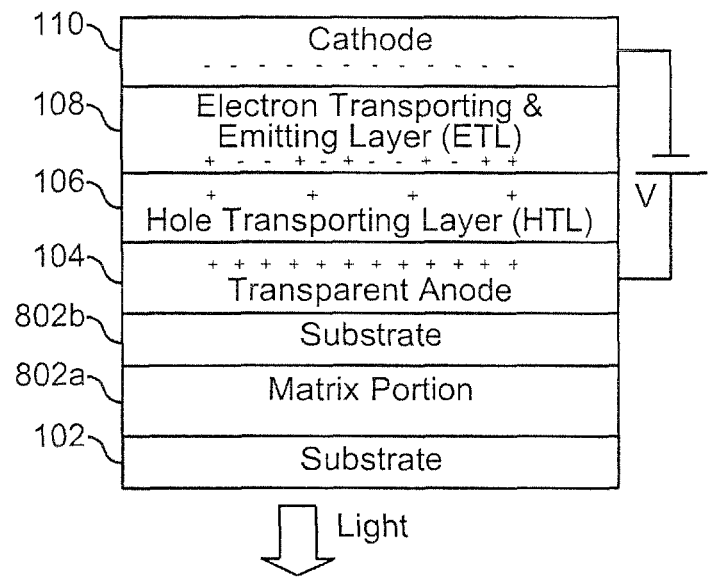
FIG. 8 is a schematic cross-sectional view of an OLED device according to certain example embodiments.
Figure 9:
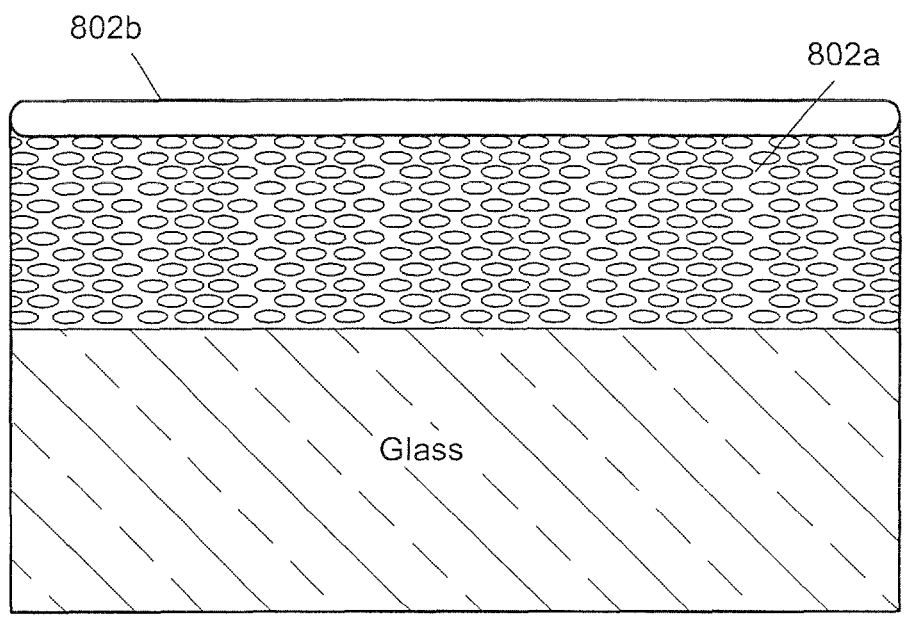
FIG. 9 is an enlarged view of the OCLS system shown in the FIG. 8 example.

FIG. 8 is a schematic cross-sectional view of an OLED device according to certain example embodiments, and FIG. 9 is an enlarged view of the OCLS system shown in FIG. 8. As shown in FIGS. 8-9, the OCLS system comprises the matrix portion 802a and the planarizer portion 802b. The OCLS system is interposed between the substrate 102 and the anode 104 (e.g., of or including ITO). The Mie-like scatterers included in the matrix portion 802a help reduce the total amount of internal reflections, which otherwise would in large part constitute "lost light." Example thicknesses of the various layers and the roughness of the planarizer portion 802b are set forth above. The FIG. 8 cathode 110 may be reflective, e.g., to help reduce TIR. In some cases, reflectance of the cathode 110 is greater than 50%, more preferably greater than 75%, and still more preferably greater than 80%. In some cases, the reflectance may be 85-90%, or even higher.

In certain example embodiments, the scattering layer may alternatively or additionally be placed on surface 1 of the glass. Doing so may in some cases increase the probability of out-coupling, while at the same time helping to attenuate reflection from the OLED. Scratch resistance, environmental stability, and/or other ruggedness aspects of the OCLS system may be enhanced to help it survive this potentially more harsh environment.

Figure 10:
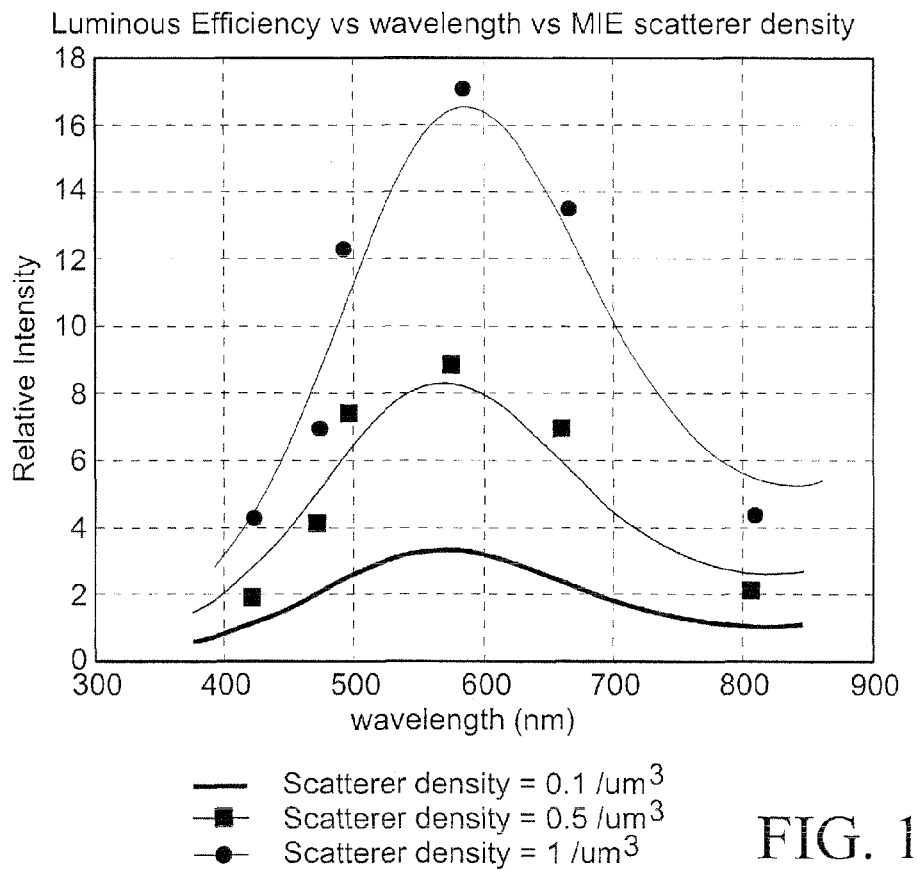
FIG. 10 is a graph showing theoretical luminous efficiencies, integrated over a half sphere, as a function of wavelength for different scatterer densities.

FIG. 10 is a graph showing theoretical luminous efficiencies, integrated over a half sphere, as a function of wavelength for different scatterer densities. As can be seen from the FIG. 10 graph, higher scattering densities translate into higher theoretical luminous intensities at all wavelengths.

Figure 11:
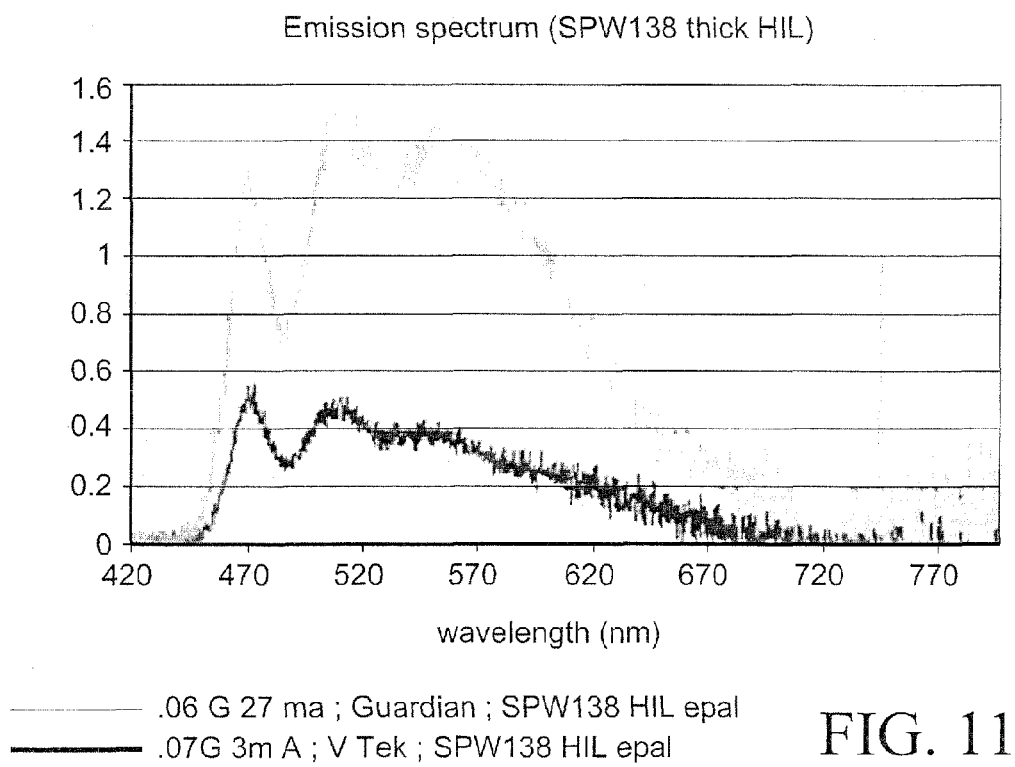
FIG. 11 is a graph plotting the actual emission spectrum from two example PLED devices.

The FIG. 11 graph generally confirms the more theoretical FIG. 10 graph. That is, FIG. 11 is a graph plotting the actual emission spectrum from two example PLED devices. The lower line in FIG. 11 represents a PLED device that lacks an OCLS system, whereas the upper line corresponds to a PLED device having an OCLS system with a 35 micron thick scatterer layer that has been planarized. In the latter example, the anode included a layer comprising ITO supported by a seed layer comprising zinc oxide, and the layer comprising ITO was ion beam etched, e.g., so as to improve its smoothness. The scatterers used were optically soft silicate spheres in a Ti based chelate.

As will be appreciated from the above, in certain example scenarios, the index matching out-coupling efficiency (>1) is boosted by a Mie-like scattering efficiency greater than one. The matrix containing the scatterers is itself a high index inorganic chelate. The scatterers are prepared, e.g., so that they comprise one or more materials. For instance, scatterers may have a concentric composition that increases scattering in some cases. The relative refractive index m, size r, and concentration of the scatterers ($1/s^3$) are chosen so that they help improve total integrated light out-coupled from the devices.

In certain example embodiments, the OCLS system may have one or more of the following and/or other advantageous characteristics:
 Ability to induce forward scattering;
 Ability to redirect light waveguide modes;
 Ability to promote Mie-like scattering, thereby reducing (and sometimes even eliminating) spectral dispersion;
 Hygroscopic scatterer material, with possible getters;
 Non-clumping and non-absorbing scatterer and matrix;
 Planarizer index-matched to underlying layers (e.g., ITO AND light emitting organic layer compositions); and/or
 Compatibility with vacuum deposition and heat treatments (including those typically used, e.g., in ITO deposition).

The OCLS structure can in certain example embodiments be improved yet further. For example, certain example embodiments relate to an OCLS structure that includes a vacuum deposited index matching layer (imL) provided over an organo-metallic scattering matrix layer. In certain example embodiments, the imL may be a silicon-inclusive layer and may comprise, for example, silicon oxide, silicon nitride, and/or silicon oxynitride. The imL may be oxygen graded, and thus index graded, in certain example embodiments. The OCLS including scattering micro-particles, the imL, and the anode may be designed such that the OLED device extraction efficiency is significantly improved, e.g., by efficiently coupling the light generated in the organic layers of the OLED devices and extracted through the glass substrate. In certain example embodiments, the refractive index of the ITO, SiOxNy index matching layer, OCLS scattering layer and the glass substrate may be provided in decreasing order.

As will be appreciated from the description above, the internal out-coupling layer of certain example embodiments may include a base scattering matrix (BSM) layer with micro scatterers. It may be disposed on a substrate using a wet process, e.g., in connection with a slot die coater. The index matching layer, on the other hand, may be deposited on the BSM layer by a vacuum deposition process such as, for example, sputtering, plasma-enhanced chemical vapor deposition (PECVD), or the like.

The technique for depositing the imL may be similar to that used in depositing the anode. For example, a SiOxNy or other silicon-inclusive imL, and an anode of or including ITO may both be deposited using a vacuum deposition process, and non-wet process, as noted above. Thus, in certain example embodiments, only the BSM layer is deposited by the wet process, which may simplify the manufacturing process, e.g., when making an integrated anode plate.

As indicated above, the imL may be of or include silicon in certain example embodiments. The refractive index of the silicon-inclusive imL can be easily tuned by varying the oxygen and/or nitrogen content in the vacuum process (e.g., in a sputtering chamber), thereby enhancing the optical performance of the OCLS stack.

In certain example embodiments, the surface of the base scattering matrix layer is very uniform and smooth. For example, surface roughness (Ra) as measured with an atomic force microscope in certain example embodiments preferably is less than 10 nm, more preferably is less than 7 nm, and most preferably is less than 5 nm. It thus may provide a smooth surface for deposition of the imL, the anode, and the PLED or OLED layers.

Figure 12:
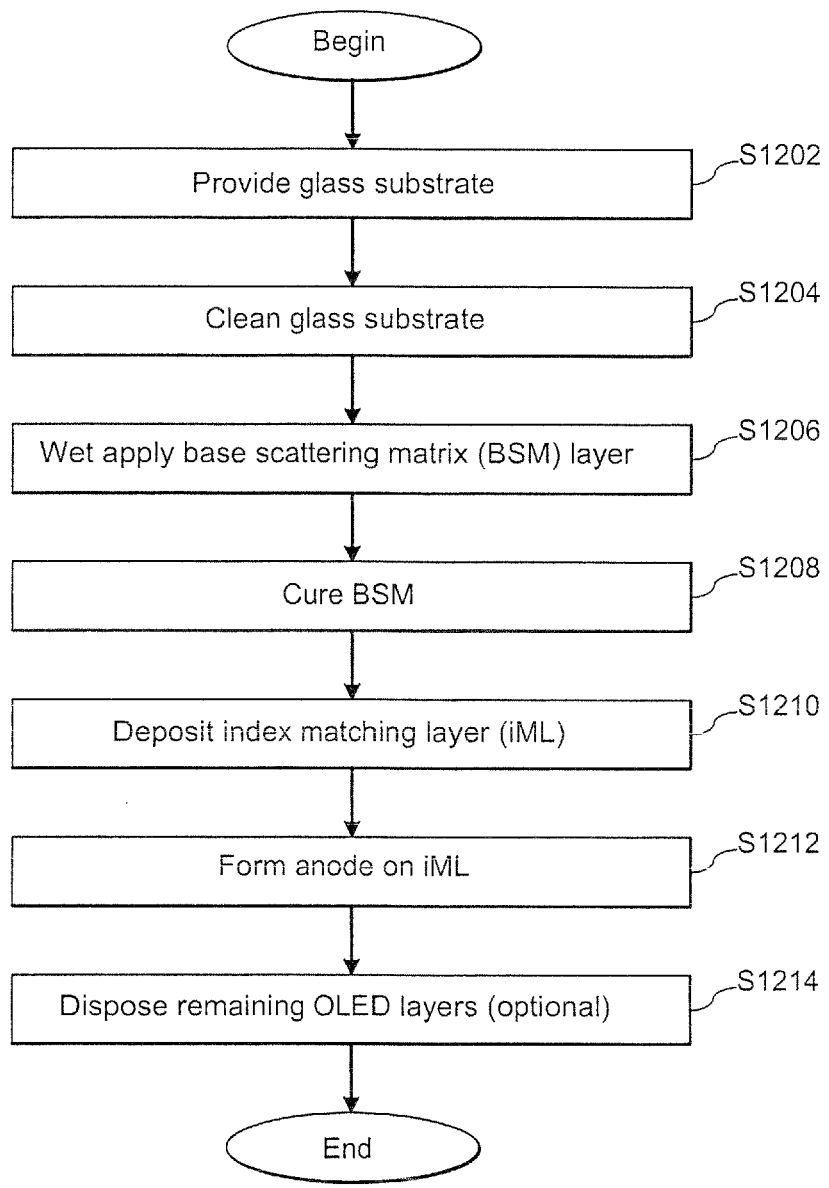
FIG. 12 is a flowchart showing an example process for making an OLED device in accordance with certain example embodiments.
Figure 12A:
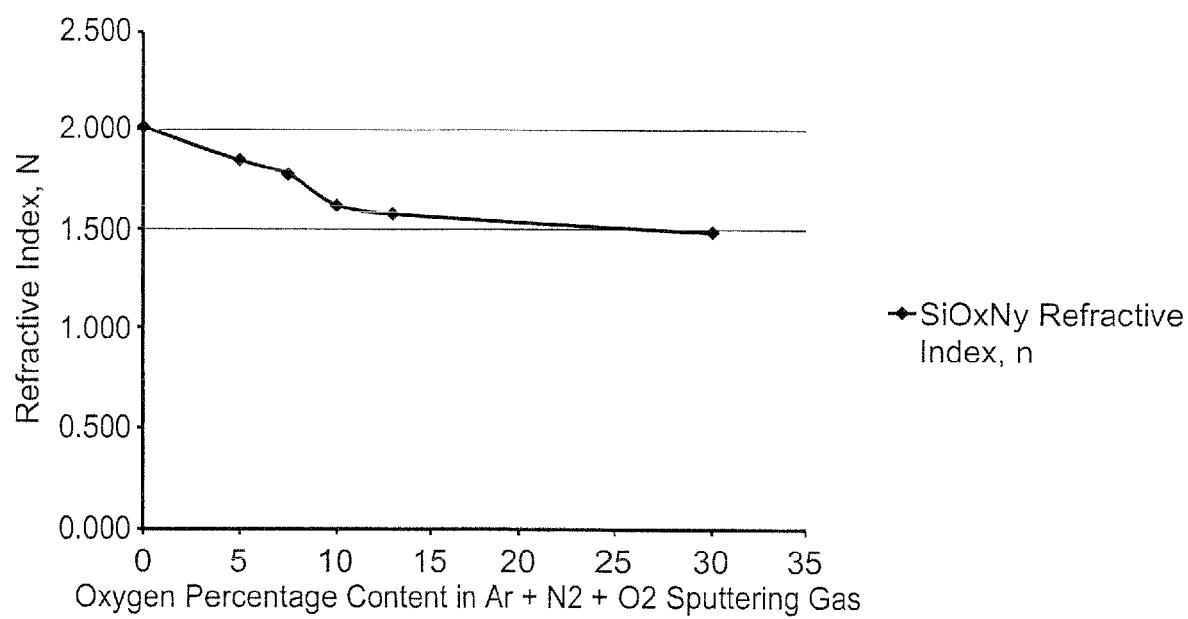
FIG. 12a shows the variation of refractive index of a SiOxNy index matching layer of certain example embodiments as a function of oxygen content in the sputter deposition chamber using a Si containing target, RF magnetron sputtering, and mixture of argon, nitrogen and oxygen gas.

Referring once again more particularly to the drawings, FIG. 12 is a flowchart showing an example process for making an OLED device in accordance with certain example embodiments; and FIGS. 13a and 13b are cross-sectional views of integrated anode plates in accordance with certain example embodiments. A glass substrate 1302 is provided in step S1202. The glass substrate 1302 may be any suitable thickness, although it is noted that thinner substrates generally are preferred for electronic device type applications. In this regard, certain example embodiments may use glass substrates that are 3 mm or thinner, more preferably 2 mm or thinner. An example thickness is 1.6 mm. The sample that is discussed below was generated on a 320 mm×380 mm substrate.

The substrate 1302 may be cleaned using any one or more suitable processes in step S1204. For example, the substrate 1302 may be cleaned ultrasonically, using deionized water, and air dried. The substrate 1302 may in addition or in the alternative be plasma treated and cleaned using an oxygen plasma.

In step S1206, the base scattering matrix (BSM) layer 1304 is wet applied on a major surface of the glass substrate 1302. The precursor for the BSM layer 1304 may include, for example, the orgao-metallic chelates of high index materials (such as, for example, titanium oxide (e.g., $TiO_2$ or other suitable stoichiometry), zirconium oxide (e.g., $ZrO_2$ or other suitable stoichiometry), etc.) and a siloxane (glmo) solvent that forms a glossy polymer. Example precursor materials are set forth above and in the '553 patent. It is noted that the viscosity of the material may be 1-20 cp., more preferably 3-10 cp., and an example viscosity that was used to generate the sample below was about 6 cp. A slot die coating method may be used to deposit a sufficiently thick, flat, and smooth coating. The thickness of the BSM layer 1304 may vary on the application and the desired optical properties. However, the BSM layer 1304 preferably has a thickness of 2-10 microns, more preferably 3-7 microns. An example thickness is 5.1 microns.

The BSM layer 1304 may be cured, as indicated in step S1208. The wet material generally will cure at a temperature of less than 300 degrees C., more preferably less than 250 degrees C., and still more preferably less than 200 degrees C., over several minutes to several hours. The sample discussed below was cured at 150 degrees C. for 2 hours using a convection oven.

The index matching layer (imL) 1306 may be formed over the BSM layer 1304 in step S1210. As indicated above, a silicon-inclusive imL 1306 may be sputter deposited or deposited using a PECVD process. The silicon-inclusive imL 1306 may comprise silicon that is oxided and/or nitrided in different example embodiments, e.g., to a selected refractive index, or to a desired graded refractive index. Dopants such as Al may be introduced to facilitate sputtering. In certain example embodiments, the imL 1306 may comprise SiOxNy that is sputter deposited using pulsed DC reactive sputtering in an environment with Ar, $N_2$, and/or $O_2$ gasses. It will be appreciated that varying the partial pressures or partial flow rates of these and/or other gasses may help to obtain the desired refractive index or refractive index gradient. FIG.

12a, for example, shows optimization of refractive index n of the SiOxNy layer of certain example embodiments. In this case, 200 nm SiOxNy films were deposited on 1.2 mm thick soda lime glass substrates using a Si (containing 8 atomic % Al) target by RF magnetron sputtering. The sputtering gas was a mixture of argon, nitrogen, and oxygen. The ratio of oxygen flow rate to the total gas content was varied from 0% to 35%. The refractive index n of the SiOxNy was varied between 2.1 to 1.46. The absorption coefficient k is very small in all of these example cases. In certain example embodiments, the refractive index may be 1.5-1.9, more preferably 1.6-1.8, with an example refractive index of about 1.6-1.7 or even 1.75. Grading may be accomplished over these ranges and one specific gradient is from about or just over 1.5 proximate the BSM layer 1304 to about 1.8 or 1.9 remote from the BSM layer 1304. The average refractive index of the gradient may in certain example embodiments be about 1.75. As with the BSM layer 1304, the thickness of the imL 1306 may vary. However, the thickness preferably will be about 10-1000 nm, more preferably 100-500 nm, still more preferably 150-300 nm, and an example target thickness is 220 nm. In certain example embodiments, no nano-scatterers are provided above the imL, but still may provide for 50% light extraction in certain example instances.

An anode layer 1308 may be provided over the imL 1306 in step S1212. The anode layer 1308 may in certain example embodiments comprise or consist of ITO. ITO generally has a high refractive index and, in certain example embodiments, the refractive index of the anode layer 1308 may be just under 2.0 (e.g., about 1.8-1.9). The thickness of the anode layer 1308 may vary; however, in certain example embodiments, its thickness may be within about 25% of the thickness of the imL 1306. The thickness is preferably 100-500 nm, still more preferably 150-300 nm, and an example target thickness is 200 nm. Most preferably, the imL 1306 has a thickness of at least about 200 nm. The anode layer 1308 may be deposited on the imL 1306 using the same or a similar technique as that used to deposit the imL 1306. For example, DC magnetron sputtering may be used to deposit the anode layer 1308. Sputtering may take place at room temperature or at elevated temperatures, and the anode may be annealed or baked post-deposition, e.g., to activate the anode. In the sample discussed below, an ITO-inclusive anode structure was annealed at 260 degrees C. for 1 hour to reduce the sheet resistance to a suitable level (e.g., below 50 ohms/square).

These steps may complete the formation of the integrated anode plate of certain example embodiments. The integrated anode plate of certain example embodiments may be forwarded to another party (e.g., a manufacturer) to construct the remaining OLED layers as indicated in step S1214, and/or build the OLED with the OCLS into a complete or more complete electronic device.

Although not specifically mentioned in the FIG. 12 example flowchart, as shown in FIG. 13b, an optional planarizing "glue layer" 1310 may be interposed between the BSM layer 1304 and the imL 1306 in certain example embodiments. A glue layer 1310 may help the imL 1306 better adhere to the BSM layer 1304. GLB is one example material that may be used in connection with the glue layer 1310, although any suitable wet applied and/or other material may be used to serve this function. Preferably, the application of the glue layer 1310 does not increase the roughness of the surface on which the imL 1306 is to be formed. In certain example embodiments, the glue layer 1310 may help smooth and/or flatten the surface on which the imL 1306 is to be formed. The glue layer 1310 preferably is 100-200 nm in certain example embodiments.

As indicated above, the refractive indexes may increase moving away from the substrate 1302. The substrate 1302 preferably has an index of refraction less than 1.6 (e.g., 1.5-1.6, and possibly about 1.52), the BSM layer 1304 preferably has an index of refraction of 1.6-1.7, the imL 1306 (and the glue layer 1310, when provided) preferably have indexes of refraction of 1.7-1.9, and the anode preferably has an index of refraction of 1.9-2.1.

Although the FIG. 12 example flowchart and the FIGS. 13a and 13b example anode plates were described in connection with OLEDs, it will be appreciated that they may be used in connection with PLEDs and/or the like, as well.

The table below shows how the process above can be used in connection with an imL comprising SiOxNy and an anode comprising ITO, with both layers being sputter deposited and annealed in various high temperature stages. The sample involved a 1.6 mm thick glass substrate with a BSM layer thickness of about 5 microns, pre-annealed or cured at 150 degrees C. for 1 hour. The imL comprising SiOxNy was formed on the BSM layer at a thickness of 220 nm, with a refractive index of 1.75. ITO was deposited thereon at a thickness of 200 nm. There was no evidence of cracking after any stage.

| Stage | Sheet Resistance (ohms/square) | % Tvis (@ 550 nm) |
|---|---|---|
| As deposited | 87 | 60.47 |
| After annealing at 200 degrees C., 1 hour in air | 47 | 63.5 |
| After annealing at 250 degrees C., 1 hour in air | 30 | 67.1 |
| After annealing at 260 degrees C., 1 hour in air | 19.1 | 72.7 |

FIGS. 14a-14c are optical microscope images of this sample at 100× magnification. More particularly, FIG. 14a shows the sample in the as-deposited state, FIG. 14b shows the sample after annealing at 200 degrees C. for 1 hour, and FIG. 14c shows the sample after annealing at 260 degrees C. for 1 hour. The integrated anode plate having the OCLS shows high thermal stability, and there was no observable change in the surface properties of the film with annealing at high temperatures, with the exception of the sheet resistance reductions and transparency increases shown above.

Figure 15A:
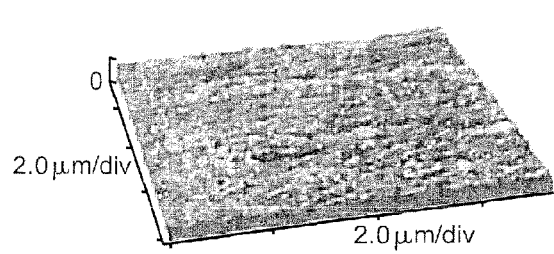
FIGS. 15a, 15b, and 16 show surface morphology characteristics, as studied using atomic force microscopy, of a base scattering matrix layer that is 5 microns thick, produced in accordance with certain example embodiments.
Figure 15B:
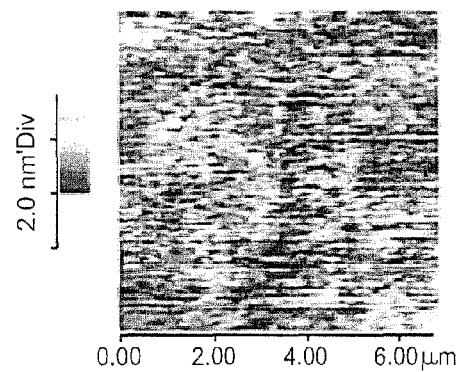
Figure 16:
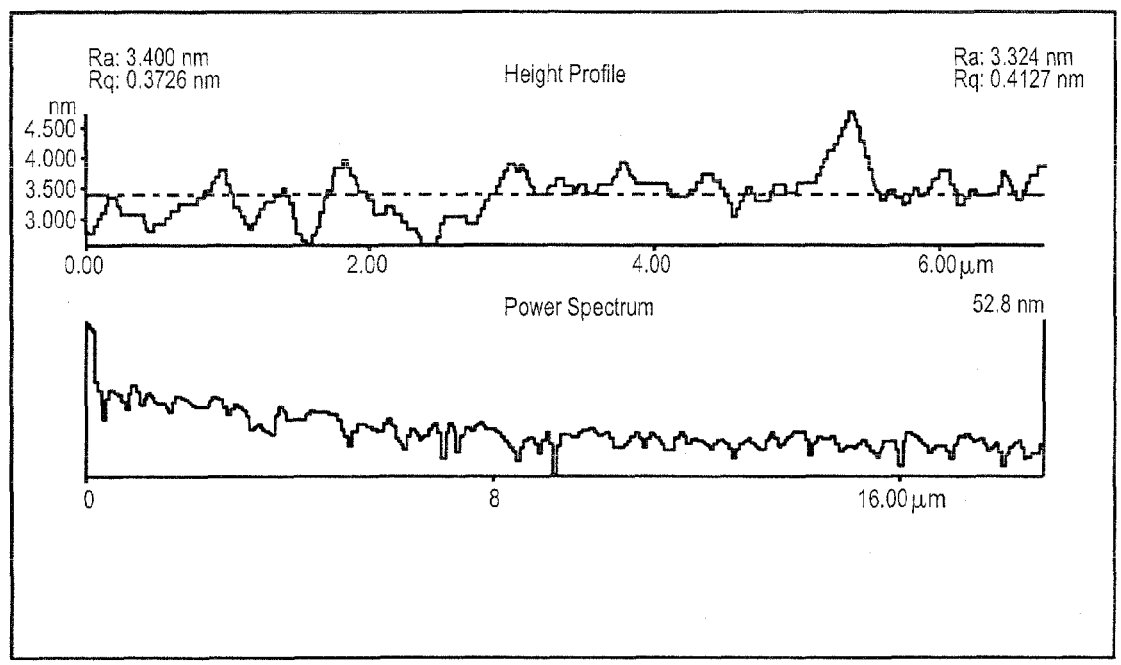

FIGS. 15 and 16 show surface morphology characteristics, as studied using atomic force microscopy (at room temperature), of a BSM layer that is 5 microns thick, produced in accordance with certain example embodiments. It can be seen that the surface is very flat. The average roughness (Ra) was about 3.4 nm. Certain example embodiments preferably will have an average roughness (Ra) of preferably less than 10 nm, more preferably less than 7 nm, and most preferably less than 5 nm. An average roughness (Ra) less than 4 nm is yet more desirable. It is noted that this portion of the OCLS need not be reduced all the way to 1 nm or so in order to create functioning embodiments but preferably will be on at least the same order of magnitude as the roughness of the glass substrate on which it is disposed.

Figure 17:
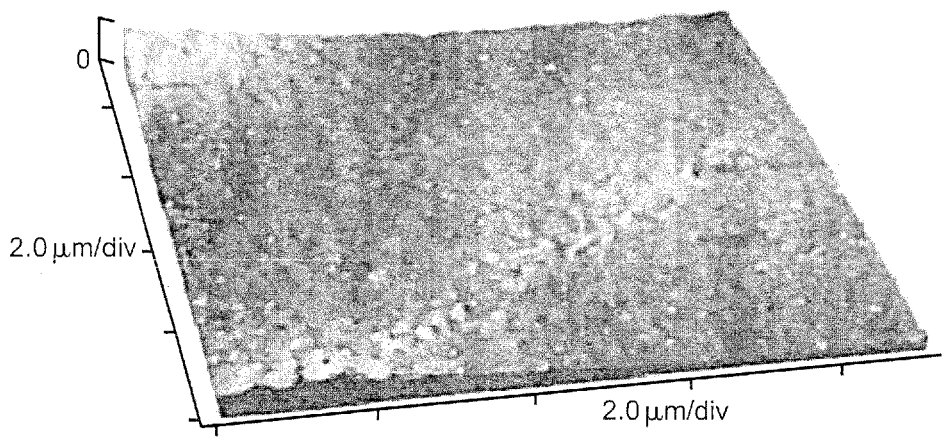
FIG. 17 is an atomic force microscope image of the BSM layer on a glass substrate, annealed at 200 degrees C. for 1 hour in air, produced in accordance with certain example embodiments.

The BSM layer is also thermally very stable. FIG. 17 is an AFM image of the BSM layer on a glass substrate, annealed at 200 degrees C. for 1 hour in air, produced in accordance with certain example embodiments. The surface structure did not significantly change after annealing, and was similar to that before annealing with similar average surface roughness.

Figure 18:
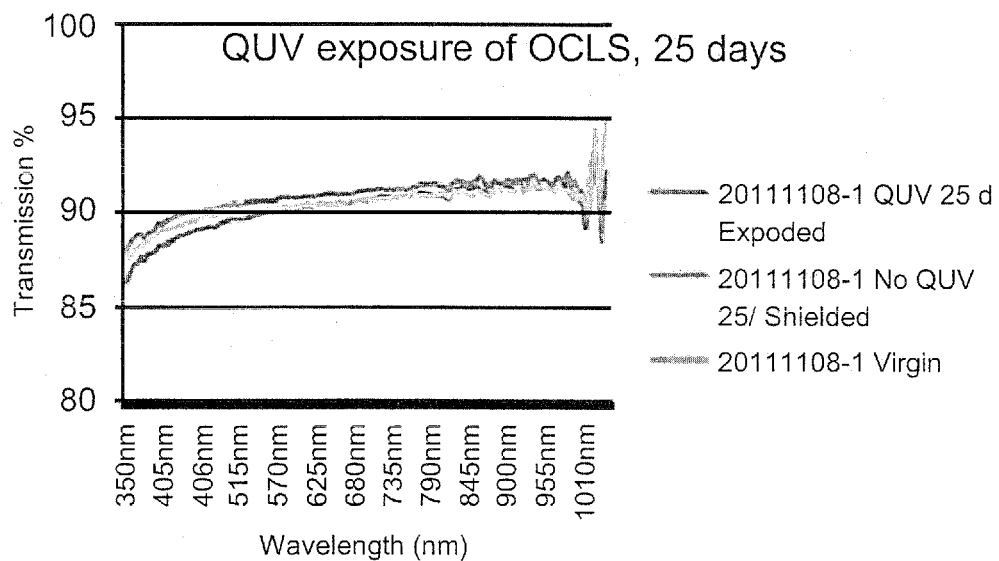
FIG. 18 shows the transmission spectra for a BSM layer on a glass substrate produced in accordance with certain example embodiments, before and after QUV exposure.

The BSM layer also has very good UV stability. The BSM sample was tested in a QUV chamber for 25 days, and FIG. 18 shows the transmission spectra of the virgin and the exposed samples. The UV exposed sample shows a less than 1% change in Tvis and almost no change in color. Preferably, Tvis will change by no more than 5%, more preferably by no more than 3%, and still more preferably by no more than 1-2%, after prolonged UV exposure corresponding to the levels associated with the QUV test described herein. Similarly, a* and b* levels preferably will change by no more than 3, more preferably by no more than 2, and still more preferably by no more than 0.5 to 1, after prolonged UV exposure corresponding to the levels associated with the QUV test described herein.

Figure 19:
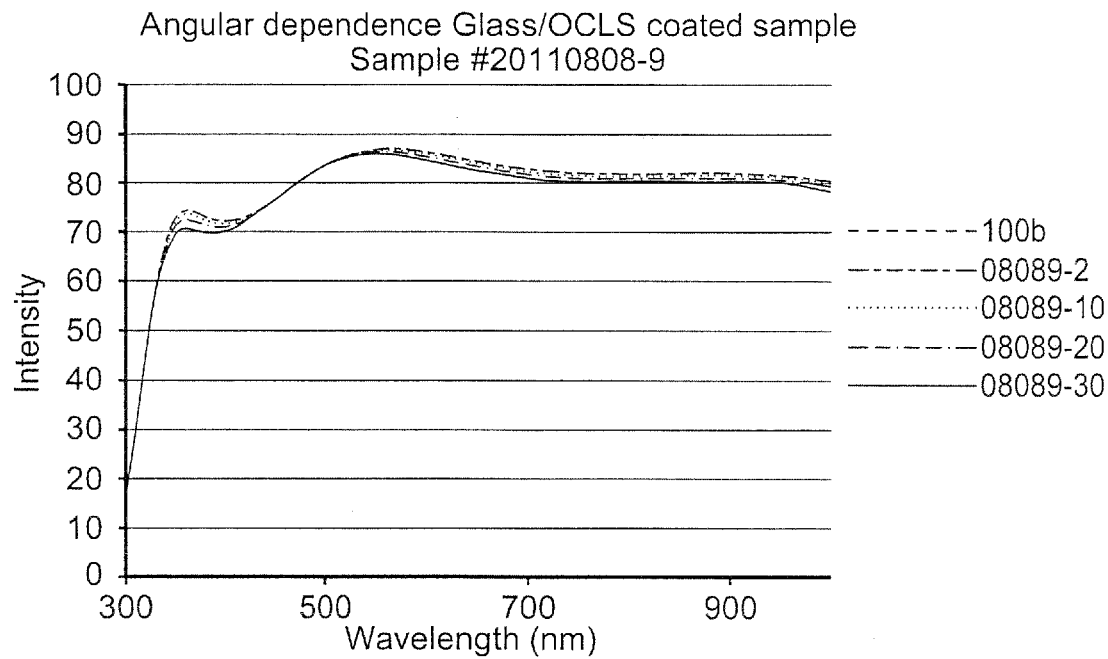
FIG. 19 shows the transmission spectra for a BSM layer on a glass substrate produced in accordance with certain example embodiments measured at several angles.

FIG. 19 shows the transmission spectra for a BSM layer on a glass substrate produced in accordance with certain example embodiments measured at several angles. It can be seen from the FIG. 19 chart and associated data that the scattering layer also has good and generally uniform scattering across wide angles and wavelengths, e.g., as indicated by the intensity values that are basically at or exceed 80 across at least the visible spectrum. Even at very sharp angles (e.g., angles less than about 45 degrees), visible transmission is still very high. It preferably is greater than 75%, more preferably greater than 80%, and sometimes is around 85%, at these sharp angles.

Evaluation of Example Integrated Anode Plate in a PLED Device

Figure 20:
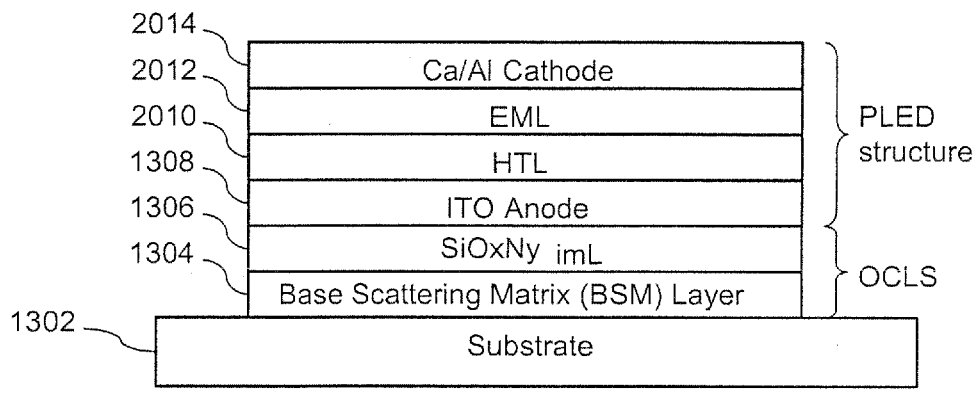
FIG. 20 is a cross-sectional view of a sample PLED device produced in accordance with certain example embodiments.

An integrated anode plate with the OCLS BSM layer 1304 and imL layer 1306, and ITO anode 1308, on a substrate 1302 was evaluated by forming a PLED device on the patterned ITO layer of a 50 mm×50 mm size sample. The device structure is shown in FIG. 20. The ITO anode 1308 was patterned photolithographically. PLED layers were deposited via a spin coating method with respect to a Pdot:PSS hole transporting layer (HTL) 2010 and a green emitting layer (EML) 2012. A 20 nm Ca/100 nm Al cathode 2014 was formed thereon via by thermal evaporation. The device was encapsulated with 0.5 mm glass to protect it from degradation, e.g., by moisture, oxygen, and/or the like. The layer thicknesses used in this sample are shown in the table below:

| Layer | Approximate Thickness |
|---|---|
| Ca/Al Cathode | 100 nm |
| EML | 120 nm |
| HTL | 100 nm |
| Anode comprising ITO | 200 nm |
| imL comprising SiOxNy | 220 nm |
| BSM layer | 5.1 microns |
| Clear Glass | 1.6 mm |

A control device was manufactured in the same way, but lacked the OCLS related BSM layer and imL. That is, a control PLED device was made using the same layer stack, using the same materials deposited in the same ways and at the same thicknesses.

The sample PLED device produced according to certain example embodiments and the control PLED device were tested by applying DC voltage varying from 0 to 9.6 volts between the anode and cathode of the device, and measuring the current through the device. The light emission though the glass substrate was measured by using the PR 650 spectrophotometer.

Figure 21:
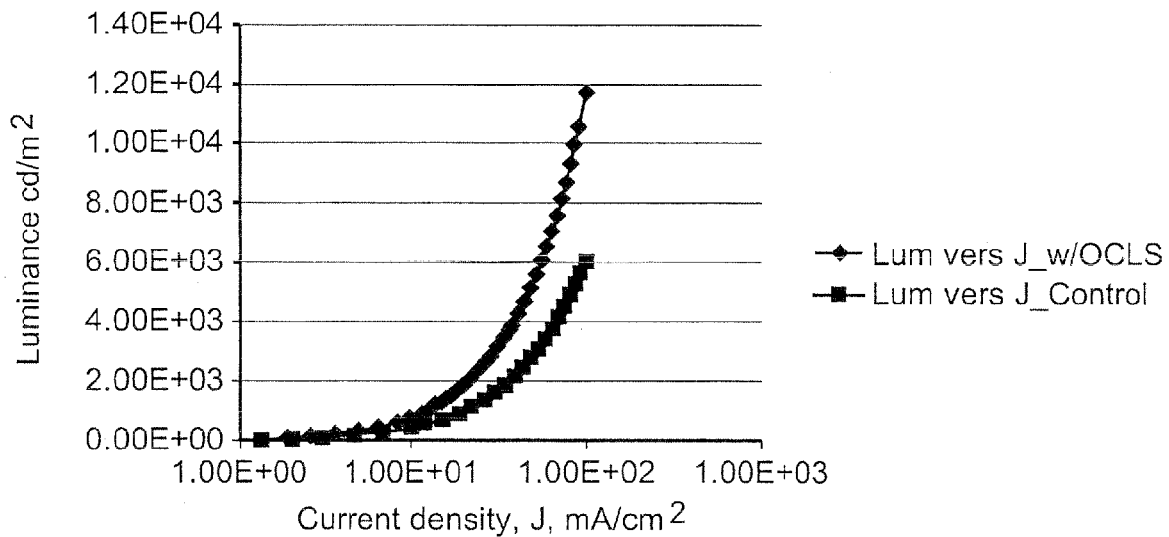
FIG. 21 is a graph showing luminance curves as a function of current density for a sample PLED device produced according to certain example embodiments and a control PLED device.

FIG. 21 is a graph showing luminance curves as a function of current density for the sample PLED device produced according to certain example embodiments and the control PLED device. The FIG. 21 graph shows that, at the same current density, the sample PLED device produced according to certain example embodiments has a much higher luminance level than the control device.

Figure 22:
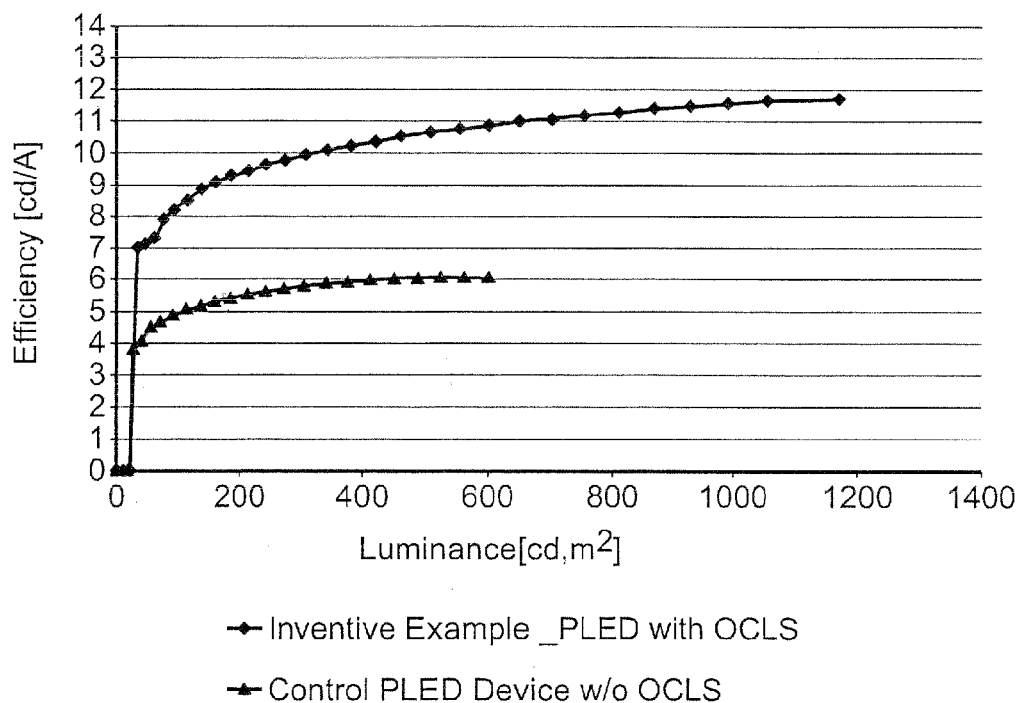
FIG. 22 is a graph showing the luminance efficiency as a function of luminance level for the sample PLED device produced according to certain example embodiments and the control PLED device.

FIG. 22 is a graph showing the luminance efficiency as a function of luminance level for the sample PLED device produced according to certain example embodiments and the control PLED device. At a luminance level of 1000 cd/m$^2$, the sample device has an efficiency of 8.5 cd/A, whereas the control device has an efficiency of 5.1 cd/A. This demonstrates that the PLED device with the integrated anode plate of certain example embodiments has a much higher luminance level as a result of the optical out coupling structure.

Although example advantages of the integrated anode plate were demonstrated above in connection with a fixed PLED device structure, the device was not optically optimized for maximum light output. Thus, the same and/or better results may be achievable where further optimizations are made. Similarly, although the sample above was discussed in connection with a green emitting layer, the advantages of certain example embodiments should be equally applicable to other color emitting devices, including white emitting devices. It will be appreciated that the integrated anode plate sample may be built into an OLED type device to achieve these advantages, as well.

As alluded to above, the thicknesses and refractive indexes of the base scattering matrix layer, the index matching layer, and the anode may be adjusted, singly, in combination, or in various sub-combinations, e.g., to further optimize the outcoupling efficiency of certain example embodiments. The concentration, size, and/or shape of the scatterers in the BSM layer can be adjusted for these and/or similar purposes. The materials used in the index matching layer and/or the anode also can be modified or substituted with other materials for these and/or similar purposes. Similar statements also hold true regarding the thicknesses and material selections for the OLED and/or PLED layers of certain example embodiments. Of course, it also will be appreciated that it is possible to improve and/or optimize the complete structure, e.g., by optically modeling. The surfaces of the base scattering matrix layer and/or the anode can further be planarized (e.g., by introducing overcoat, planarizing, passivation layers, and/or the like), e.g., to reduce the surface roughness.

Certain example embodiments may be used in connection with soda lime silicate glass, and/or so-called low-iron glass. For instance, the substrate 102 in FIG. 8, for example, may be a low-iron glass substrate. Low-iron glass is described in, for example, U.S. Pat. Nos. 7,893,350; 7,700,870; 7,557,053; 6,299,703; and 5,030,594, and U.S. Publication Nos. 2006/0169316; 2006/0249199; 2007/0215205; 2009/0223252; 2010/0122728; 2010/0255980; and 2011/0275506. The entire contents of each of these documents is hereby incorporated herein by reference.

In certain example embodiments, a method of making a coated article is provided. A base scattering matrix layer is wet applied, directly or indirectly, on a glass substrate, with a precursor for the base scattering matrix layer including an organo-metallic chelate of a high index material and siloxane solvent. The wet applied base scattering matrix layer is cured. A silicon-inclusive index matching layer is vacuum coated, directly or indirectly, on the cured base scattering matrix layer. An anodic layer is vacuum coated, directly or indirectly, on the index matching layer. The cured base scattering matrix layer has a refractive index of 1.55-1.7, the index matching layer has a refractive index of 1.7-1.9, and the anodic layer has a refractive index of 1.9-2.1.

In addition to the features of the previous paragraph, in certain example embodiments, the glass substrate may a refractive index of less than 1.6.

In addition to the features of either of the previous paragraphs, in certain example embodiments, the cured base scattering matrix layer may be about 2-30 microns thick and/or may have an average surface roughness (Ra) less than 4 nm.

In addition to the features of any of the previous three paragraphs, in certain example embodiments, the wet applying may be practiced using a slot die coater.

In addition to the features of any of the previous four paragraphs, in certain example embodiments, the precursor from which the base scattering matrix layer is formed may have a viscosity of 4-8 cp.

In addition to the features of any of the previous five paragraphs, in certain example embodiments, the base scattering matrix layer, when cured, may comprise an isotropic layer matrix including an organo-metallic chelate hybrid matrix with scatterers dispersed therein.

In addition to the features of the previous paragraph, in certain example embodiments, the scatterers may include titanium oxide, zirconium oxide, and/or hafnium oxide particles.

In addition to the features of any of the previous seven paragraphs, in certain example embodiments, the curing may be performed at a temperature less than 200 degrees C. for between a few minutes (e.g., from 2-3 minutes) to a few hours (e.g., 1-2 hours, and possibly even as high as 24 hours in some cases).

In addition to the features of any of the previous eight paragraphs, in certain example embodiments, the index matching layer may comprise silicon oxynitride.

In addition to the features of any of the previous nine paragraphs, in certain example embodiments, the anodic layer may comprise indium tin oxide.

In addition to the features of the previous paragraph, in certain example embodiments, the substrate with the cured base scattering matrix layer, index matching layer, and anodic layer thereon may be annealed, e.g., in order to increase transparency and/or reduce sheet resistance of the anodic layer.

In addition to the features of any of the previous 11 paragraphs, in certain example embodiments, a layer comprising GLB may be disposed on the base scattering matrix layer, with the index matching layer optionally being disposed directly over and contacting the layer comprising GLB.

In certain example embodiments, a method of making an electronic device is provided. A coated article made according to the method of any of the previous 12 paragraphs may be provided. The anodic layer is patterned. A hole transport layer, an emitting layer, and a reflective cathodic layer may be disposed, in that order, on the patterned anodic layer, in making the electronic device.

In addition to the features of the previous paragraph, in certain example embodiments, the emitting layer may be an electronic transport and emitting layer, and the electronic device may be an OLED-based device. Alternatively, the electronic device may be a PLED-based device.

In certain example embodiments, a coated article is provided and comprises: a glass substrate; a base scattering matrix layer wet applied, directly or indirectly, on the glass substrate, the base scattering matrix layer including an isotropic layer matrix including an organo-metallic chelate hybrid matrix with scatterers dispersed therein; a silicon-inclusive index matching layer sputter-deposited, directly or indirectly, on the base scattering matrix layer; and a transparent conductive coating (TCC) sputter-deposited, directly or indirectly, on the index matching layer. The base scattering matrix layer has a refractive index of 1.6-1.7, the index matching layer has a refractive index of 1.7-1.9, and the TCC has a refractive index of 1.9-2.1.

In addition to the features of the previous paragraph, in certain example embodiments, the glass substrate may have a refractive index of less than 1.6.

In addition to the features of the previous paragraph, in certain example embodiments, the cured base scattering matrix layer may be about 3-20 microns thick and/or may have an average surface roughness (Ra) less than 4 nm.

In addition to the features of any of the previous three paragraphs, in certain example embodiments, the scatterers may include titanium oxide, zirconium oxide, and/or hafnium oxide particles.

In addition to the features of any of the previous four paragraphs, in certain example embodiments, the index matching layer may comprise silicon oxynitride and the TCC is anodic.

In addition to the features of any of the previous five paragraphs, in certain example embodiments, the TCC may comprise indium tin oxide.

In addition to the features of any of the previous six paragraphs, in certain example embodiments, the index matching layer may have a thickness of at least about 200 nm.

In addition to the features of any of the previous seven paragraphs, in certain example embodiments, a layer comprising GLB may be interposed between the base scattering matrix layer and the index matching layer, with the layer comprising GLB optionally having a thickness of 100-200 nm.

In certain example embodiments, an electronic device is provided and comprises: a glass substrate; a base scattering matrix layer wet applied, directly or indirectly, on the glass substrate, the base scattering matrix layer having a thickness of about 3-20 microns when cured and including an isotropic layer matrix including an organo-metallic chelate hybrid matrix with high refractive index light scatterers dispersed therein; a silicon-inclusive index matching layer sputter-deposited, directly or indirectly, on the base scattering matrix layer; and a first transparent conductive coating (TCC) sputter-deposited on the index matching layer. Refractive indices of the glass substrate, the base scattering matrix layer, the index matching layer, and the first TCC may increase with each layer, moving away from the glass substrate. A hole transport layer, an emitting layer, and a reflective second TCC disposed are provided, in that order, over the first TCC.

In addition to the features of the previous paragraph, in certain example embodiments, the index matching layer may comprise silicon oxynitride and may be at least 200 nm thick, the first TCC may be anodic and may for example comprise ITO, and/or the second TCC may be cathode and for example may comprise Al, Ag, Pd, Cu, or a combination thereof.

Although certain example embodiments have been described in connection with OLEDs and/or PLEDs, it will be appreciated that the techniques described herein may be used in connection with other types of light emitting diodes (LEDs) including, for example, inorganic light emitting diodes, and/or other lighting systems, etc.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article, the method comprising:
    wet applying a base scattering matrix layer, directly or indirectly, on a glass substrate, a precursor for the base scattering matrix layer including an organo-metallic chelate of a high index material and siloxane solvent;
    curing the wet applied base scattering matrix layer;
    vacuum coating a silicon-inclusive index matching layer, directly or indirectly, on the cured base scattering matrix layer; and
    vacuum coating an anodic layer, directly or indirectly, on the index matching layer, wherein the cured base scattering matrix layer has a refractive index of 1.55-1.7, the index matching layer has a refractive index of 1.7-1.9, and the anodic layer has a refractive index of 1.9-2.1.

2. The method of claim 1, wherein the glass substrate has a refractive index of less than 1.6.

3. The method of claim 1, wherein the cured base scattering matrix layer is about 2-30 microns thick and has an average surface roughness (Ra) less than 4 nm.

4. The method of claim 3, wherein the wet applying is practiced using a slot die coater.

5. The method of claim 4, wherein the precursor from which the base scattering matrix layer is formed has a viscosity of 4-8 cp.

6. The method of claim 1, wherein the base scattering matrix layer, when cured, comprises an isotropic layer matrix including an organo-metallic chelate hybrid matrix with scatterers dispersed therein.

7. The method of claim 6, wherein the scatterers include titanium oxide, zirconium oxide, and/or hafnium oxide particles.

8. The method of claim 1, wherein the curing is performed at a temperature less than 200 degrees C. for between a few minutes to a few hours.

9. The method of claim 1, wherein the index matching layer comprises silicon oxynitride.

10. The method of claim 1, wherein the anodic layer comprises indium tin oxide.

11. The method of claim 10, further comprising annealing the substrate with the cured base scattering matrix layer, index matching layer, and anodic layer thereon, in order to increase transparency and reduce sheet resistance of the anodic layer.

12. The method of claim 1, further comprising disposing a glue layer on the base scattering matrix layer, the index matching layer being disposed directly over and contacting the glue layer.

13. A method of making an electronic device, the method comprising:
    providing a coated article made according to the method of claim 1;
    patterning the anodic layer; and
    disposing a hole transport layer, an emitting layer, and a reflective cathodic layer, in that order, on the patterned anodic layer, in making the electronic device.

14. The method of claim 13, wherein the emitting layer is an electronic transport and emitting layer, and the electronic device is an COED-based device.

15. The method of claim 13, wherein the electronic device is a PLED-based device.

* * * * *